(12) United States Patent
You et al.

(10) Patent No.: US 9,755,192 B2
(45) Date of Patent: Sep. 5, 2017

(54) METHOD OF CUTTING SUBSTRATE AND METHOD OF MANUFACTURING DISPLAY APPARATUS

(71) Applicant: Samsung Display Co., Ltd., Yongin-si, Gyeonggi-do (KR)

(72) Inventors: Junghwa You, Yongin-si (KR); Taeyong Kim, Yongin-si (KR); Hyojin Kim, Yongin-si (KR); Ilyoung Jeong, Yongin-si (KR); Gyoowan Han, Yongin-si (KR); Jekil Ryu, Yongin-si (KR); Jinho Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/967,090

(22) Filed: Dec. 11, 2015

(65) Prior Publication Data
US 2016/0315293 A1    Oct. 27, 2016

(30) Foreign Application Priority Data

Apr. 22, 2015   (KR) .......................... 10-2015-0056892

(51) Int. Cl.
*H01L 21/00*    (2006.01)
*H01L 51/56*    (2006.01)
(Continued)

(52) U.S. Cl.
CPC .......... *H01L 51/56* (2013.01); *B23K 26/0608* (2013.01); *B23K 26/0624* (2015.10);
(Continued)

(58) Field of Classification Search
CPC ....................................................... H01L 51/56
(Continued)

(56) References Cited

U.S. PATENT DOCUMENTS

2001/0035401 A1 * 11/2001 Manor ............... B23K 26/0604
                                                            219/121.72
2002/0125232 A1    9/2002 Choo et al.
(Continued)

FOREIGN PATENT DOCUMENTS

JP    54-121964       8/1979
JP    2011-224600 A   11/2011
(Continued)

OTHER PUBLICATIONS

Partial English translation of relevant parts of Japanese Publication JP 54-121964 dated Aug. 25, 1979, (1 page).
(Continued)

*Primary Examiner* — Jami M Valentine
(74) *Attorney, Agent, or Firm* — Lewis Roca Rothgerber Christie LLP

(57) ABSTRACT

A method of cutting a substrate includes: forming a first protective layer on a first surface of the substrate; forming a removal area where a portion of the first protective layer is removed by irradiating the first protective layer at the portion of the first protective layer with a first laser beam; and forming a cutting area by removing a portion of the substrate by irradiating the substrate with a second laser beam at the removal area, after irradiating the first protective layer with the first laser beam.

26 Claims, 47 Drawing Sheets

(51) Int. Cl.
*B23K 26/38* (2014.01)
*B23K 26/0622* (2014.01)
*B23K 26/18* (2006.01)
*B23K 26/06* (2014.01)
*B23K 26/40* (2014.01)
*B23K 26/402* (2014.01)
*H01L 51/52* (2006.01)
*B23K 103/00* (2006.01)

(52) U.S. Cl.
CPC .............. *B23K 26/18* (2013.01); *B23K 26/38* (2013.01); *B23K 26/40* (2013.01); *B23K 26/402* (2013.01); *B23K 2203/00* (2013.01); *B23K 2203/42* (2015.10); *B23K 2203/50* (2015.10); *H01L 51/5253* (2013.01); *H01L 2251/566* (2013.01)

(58) Field of Classification Search
USPC ........................................................ 438/28
See application file for complete search history.

(56) References Cited

U.S. PATENT DOCUMENTS

| 2004/0150766 | A1 | 8/2004 | Choo et al. | |
|---|---|---|---|---|
| 2010/0200550 | A1* | 8/2010 | Kumagai | B23K 26/0057 219/121.72 |
| 2011/0312157 | A1* | 12/2011 | Lei | H01L 21/78 438/462 |
| 2012/0146922 | A1 | 6/2012 | Kang et al. | |
| 2014/0011338 | A1* | 1/2014 | Lei | H01L 21/78 438/463 |

FOREIGN PATENT DOCUMENTS

| JP | 2012-128826 A | 7/2012 |
|---|---|---|
| KR | 10-2000-0014954 A | 3/2000 |
| KR | 10-2005-0070251 A | 7/2005 |
| KR | 10-2007-0054438 A | 5/2007 |
| KR | 10-2008-0114052 A | 12/2008 |
| KR | 10-2012-0015366 A | 2/2012 |
| KR | 10-1476919 B1 | 12/2014 |
| KR | 10-2015-0008246 | 1/2015 |

OTHER PUBLICATIONS

Partial English translation of relevant parts of Japanese Publication JP 2011-224600 A dated Nov. 10, 2011, (2 pages).
Partial English translation of relevant parts of Korean Publication 10-1476919 B1 dated Dec. 26, 2014, (2 pages).
Partial English translation of relevant parts of Korean Publication KR 10-2012-0015366 A dated Feb. 21, 2012, (4 pages).
Partial English translation of relevant part of Korean Publication No. KR 10-2015-0008246 dated Jan. 22, 2015, (1 page).
KIPO Office Action dated Nov. 21, 2016, for corresponding Korean Patent Application No. 10-2015-0056892 (7 pages).

* cited by examiner

METHOD OF CUTTING SUBSTRATE AND METHOD OF MANUFACTURING DISPLAY APPARATUS

CROSS-REFERENCE TO RELATED APPLICATION

This application claims priority to and the benefit of Korean Patent Application No. 10-2015-0056892, filed on Apr. 22, 2015, in the Korean Intellectual Property Office, the disclosure of which is incorporated herein in its entirety by reference.

BACKGROUND

1. Field

One or more example embodiments relate to a display apparatus, a method of cutting a substrate, and a method of manufacturing a display apparatus.

2. Description of the Related Art

A process for cutting a substrate in a desired shape varies. The cutting process needs to be performed without damaging the substrate, according to materials of the substrate.

Meanwhile, a display apparatus has a shape in which a display unit is formed on a substrate producing an image. Also, the display apparatus is completely manufactured after going through a cutting process in which the display unit is formed on the substrate, for convenience of manufacturing.

Here, the cutting process affects the characteristics of the display apparatus. However, when the substrate is formed of flexible materials, it may be difficult to control the cutting process.

As a result, when a manufacturing process of the display apparatus is performed, there may be limits on the ability to improve desired characteristics of the display apparatus and the efficiency of the manufacturing process.

The above information disclosed in this Background section is only for enhancement of understanding of the background of the invention and therefore it may contain information that does not constitute prior art.

SUMMARY

One or more example embodiments include a method of cutting a substrate and a method of manufacturing a display apparatus.

Additional aspects of example embodiments of the present invention will be set forth in part in the description which follows and, in part, will be apparent from the description, or may be learned by practice of the presented embodiments.

According to one or more example embodiments, a method of cutting a substrate includes: forming a first protective layer on a first surface of the substrate; forming a removal area where a portion of the first protective layer is removed by irradiating the first protective layer at the portion of the first protective layer with a first laser beam; and forming a cutting area by removing a portion of the substrate by irradiating the substrate with a second laser beam at the removal area, after irradiating the first protective layer with the first laser beam.

The method may further include forming a first adhesive layer between the first protective layer and the substrate.

The method may further include, after the forming of the cutting area, removing the first protective layer from the substrate.

The irradiating of the first protective layer with the first laser beam may include controlling the first laser beam such that a focus of the first laser beam is spaced apart from an upper surface of the first protective layer.

The second laser beam may be a pulse laser beam and may have a pulse width of femto seconds to hundreds of femto seconds.

The forming of the removal area may include: forming, on the first protective layer, a plurality of preliminary removal areas spaced apart from one another by irradiating the first protective layer with the first laser beam at the preliminary removal areas; and irradiating the first protective layer with the first laser beam at areas between the plurality of preliminary removal areas.

The method may further include forming a second protective layer on a second surface of the substrate that is opposite the first surface of the substrate.

The method may further include forming a second adhesive layer between the second protective layer and the substrate.

The method may further include forming the cutting area by removing a portion of the second protective layer by irradiating the second protective layer with the second laser beam at the portion of the second protective layer.

The second protective layer may be thinner than the first protective layer.

According to some example embodiments of the present invention, in a method of manufacturing a display apparatus comprising a display unit formed on a substrate, the method includes: forming a first protective layer on a first surface of the substrate; forming a removal area where a portion of the first protective layer is removed by irradiating the first protective layer with a first laser beam; and forming a cutting area by removing a portion of the substrate by irradiating the substrate with a second laser beam at the removal area, after irradiating the first protective layer with the first laser beam.

The method may further include positioning the display unit on the first surface of the substrate, wherein the display unit is apart from the cutting area on the substrate.

The method may further include positioning the display unit on the first' surface of the substrate, wherein the display unit overlaps the cutting area on the substrate.

The first protective layer may cover the display unit.

The first protective layer may not overlap the display unit.

The method may further include forming an encapsulating unit on the display unit, wherein the encapsulating unit is arranged between the display unit and the first protective layer.

The method may further include forming a first adhesive layer between the first protective layer and the substrate.

The first adhesive layer may be between the first protective layer and the display unit.

The method may further include, after the forming of the cutting area, removing the first protective layer from the substrate.

The irradiating of the first protective layer with the first laser beam may include controlling the first laser beam such that a focus of the first laser beam is spaced apart from an upper surface of the first protective layer.

The second laser beam may be a pulse laser beam, and may have a pulse width of femto seconds to hundreds of femto seconds.

The forming of the removal area may include: forming, on the first protective layer, a plurality of preliminary removal areas spaced apart from one another by irradiating the first protective layer with the first laser beam at the preliminary removal areas; and irradiating the first protective layer with the first laser beam at areas between the plurality of preliminary removal areas.

The method may further include forming a second protective layer on a second surface of the substrate opposite the first surface of the substrate.

The method may further include forming a second adhesive layer between the second protective layer and the substrate.

The method may further include forming the cutting area by removing a portion of the second protective layer by irradiating the second protective layer with the second laser beam at the portion of the second protective layer.

The second protective layer may be thinner than the first protective layer.

The cutting area may be formed so that the display apparatus and a dummy area adjacent the display apparatus are formed, based on the formed cutting area, and the cutting area may be between the display apparatus and the dummy area.

The cutting area may be formed so that the display apparatus and another display apparatus adjacent the display apparatus are formed, based on the formed cutting area, and the cutting area may be between the display apparatus and the another display apparatus.

BRIEF DESCRIPTION OF THE DRAWINGS

These and/or other aspects will become more apparent and more readily appreciated from the following description of the example embodiments, taken in conjunction with the accompanying drawings in which.

DETAILED DESCRIPTION

Figure 1:
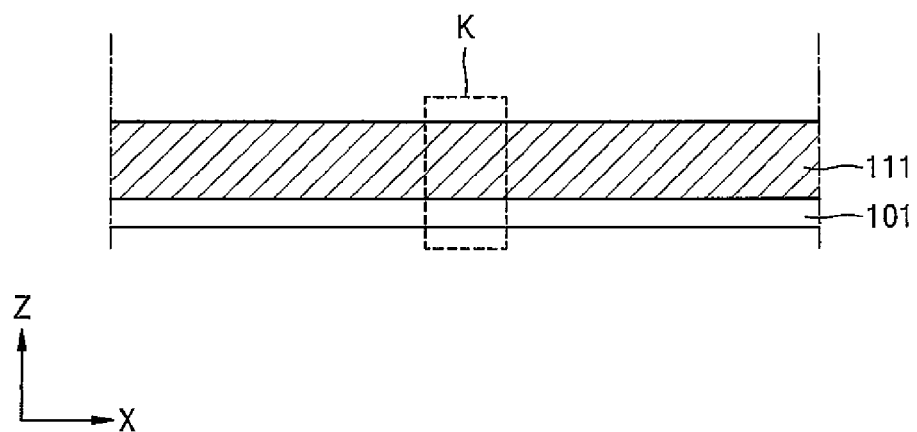
FIGS. 1 through 8 are views for describing a method of cutting a substrate, according to an example embodiment of the present invention.

Reference will now be made in detail to example embodiments, examples of which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects of the present description.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Hereinafter, example embodiments of the present invention will be described in more detail by referring to the accompanying drawings, wherein like reference numerals refer to like elements, and their repeated descriptions are omitted.

FIGS. 1 through 8 are views for describing a method of cutting a substrate 101, according to an example embodiment.

Referring to FIG. 1, a first protective layer 111 is formed on a surface of the substrate 101. For example, the first protective layer 111 may be formed on an upper surface of the substrate 101.

The substrate 101 may be formed of various materials. For example, the substrate 101 may be formed of glass, a metal, or other organic materials.

According to some example embodiments, the substrate 101 may be formed of a flexible material. For example, the substrate 101 may be formed of a material that enables the substrate 101 to be relatively easily bent, curved, folded, or wound.

According to some example embodiments, the substrate 101 may be formed of ultrathin glass, metal, or plastic. For example, when the substrate 101 is formed of plastic, the substrate 101 may be formed of polyimide (PI). However, this is only an example material, and various other suitable substrate materials may be used to form the substrate 101.

The first protective layer 111 may be formed on a surface of the substrate 101 to protect the surface of the substrate 101. The first protective layer 111 may be formed of various materials. For example, the first protective layer 111 may be formed of one or more insulating materials.

According to some example embodiments, the first protective layer 111 may be attached to the substrate 101 as a film type. For example, the first protective layer 111 may be a film containing an organic material. For example, the first protective layer 111 may be a polyethylene terephthalate (PET) film.

According to some example embodiments, the first protective layer 111 may include at least one selected from the group consisting of polycarbonate (PC), polypropylene terephthalate (PPT), polynaphtalene terephthalate (PEN), cycloolefin polymer (COP), cycloolefin copolymer (COC), polymethyl methacrylate (PMMA), polyimide (PI), polyarylate (PAR), polyethersulfone (PES), polyetherimide (PEI), silicon resins, fluorine resins, and modified epoxy resins.

Figure 2:
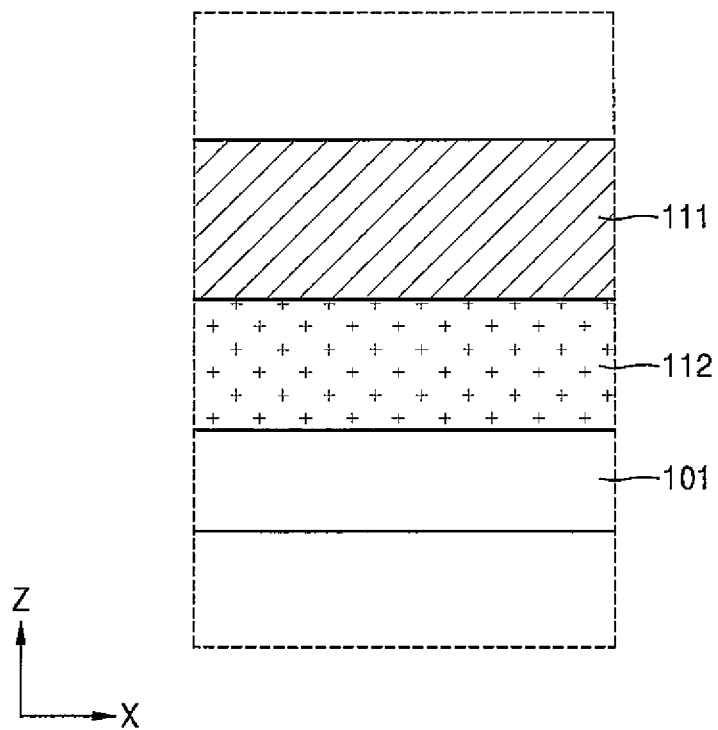

According to some example embodiments, a first adhesive layer 112 may further be formed between the substrate 101 and the first protective layer 111, as illustrated in FIG. 2. FIG. 2 is an enlarged view of region K of FIG. 1.

The first protective layer 111 may be attached to the surface of the substrate 101 via the first adhesive layer 112.

The first adhesive layer 112 may include various adhesive materials.

According to some example embodiments, the first adhesive layer 112 may contain a silicon-based material. Accordingly, the first adhesive layer 112 may be removed from the substrate 101 in a subsequent manufacturing operation, and thus, the first protective layer 111 may be removed from the substrate 101.

Figure 3A:
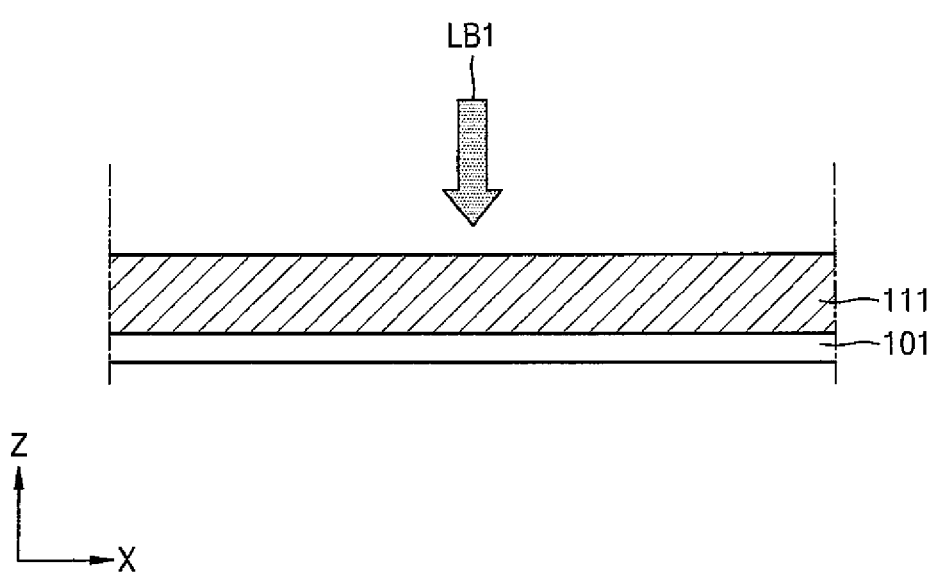

Next, referring to FIG. 3A, a first laser beam LB1 is irradiated toward the first protective layer 111. For example, the first laser beam LB1 may be irradiated toward a surface of the first protective layer 111, which is opposite to a surface of the first protective layer 111 facing the substrate 101.

The first laser beam LB1 may be various types of laser beams.

According to some example embodiments, the first laser beam LB1 may be a type of laser beam that has low transmittance with respect to the first protective layer 111. Thus, when the first laser beam LB1 is irradiated onto the first protective layer 111, the distribution of the first laser beam LB1 in a direction (e.g., an X-axis direction of FIG. 3A) perpendicular to a thickness direction of the first protective layer 111 may be reduced.

Figure 3B:
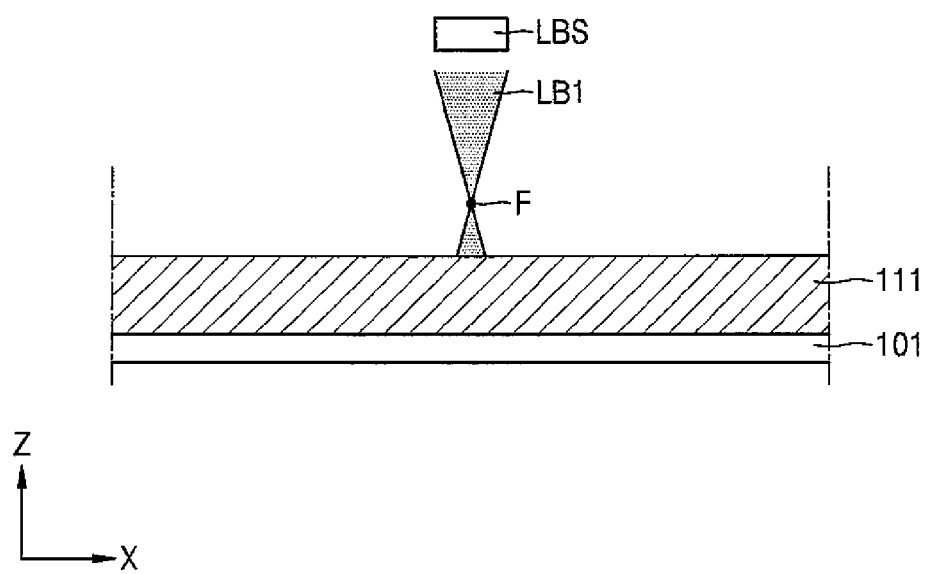

According to some example embodiments, when the first laser beam LB1 is irradiated toward a surface of the first protective layer 111, as illustrated in FIG. 3B, a first laser beam irradiation device LBS may be controlled to irradiate the first laser beam LB1 such that a focus (or focal point) F of the first laser beam LB1 is apart (e.g., separated by a distance) from the surface of the first protective layer 111. For example, an optical member of the first laser beam irradiation, device LBS may be controlled.

Referring to FIG. 3B, the focus F of the first laser beam LB1 is apart (e.g., separated by a distance) from a surface of the first protective layer 111. That is, the first laser beam LB1 may not be a focused beam but may be a defocused beam. When the first laser beam LB1 is irradiated toward the first protective layer 111 such that the focus F of the first laser beam LB1 is distanced from the surface of the first protective layer 111, the first laser beam LB1 may be irradiated onto a large area (e.g., relative to an area of the focus F) of the surface of the first protective layer 111, and energy that is applied per unit area of the first protective layer 111 may be reduced.

Figure 4:
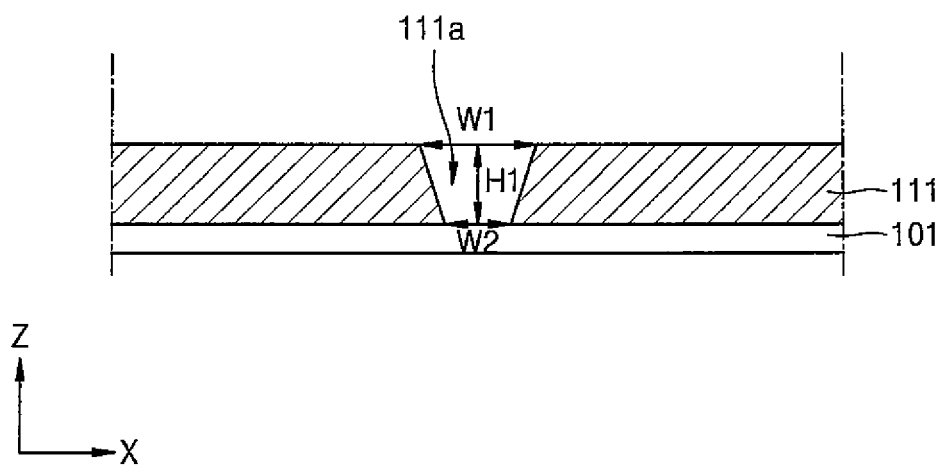

As illustrated in FIG. 4, a removal area 111a where a portion of the first protective area 111 is removed is formed by irradiating the first laser beam LB1 toward the first protective layer 111.

The removal area 111a may have a height H1 that corresponds to a total thickness of the first protective layer 111. According to some example embodiments, the height H1 of the removal area 111a may correspond to a portion of the thickness of the first protective layer 111.

The removal area 111a, which has a width, may have one or more widths. According to some example embodiments, the removal area 111a may have a width W2 and a width W1. The width W2 is a width of a portion of the removal area 111a that is adjacent to the substrate 101, and the width W1 is a width of a portion of the removal area 111a that is furthest from the substrate 101, wherein the width W2 may be less than the width W1.

Figure 5:
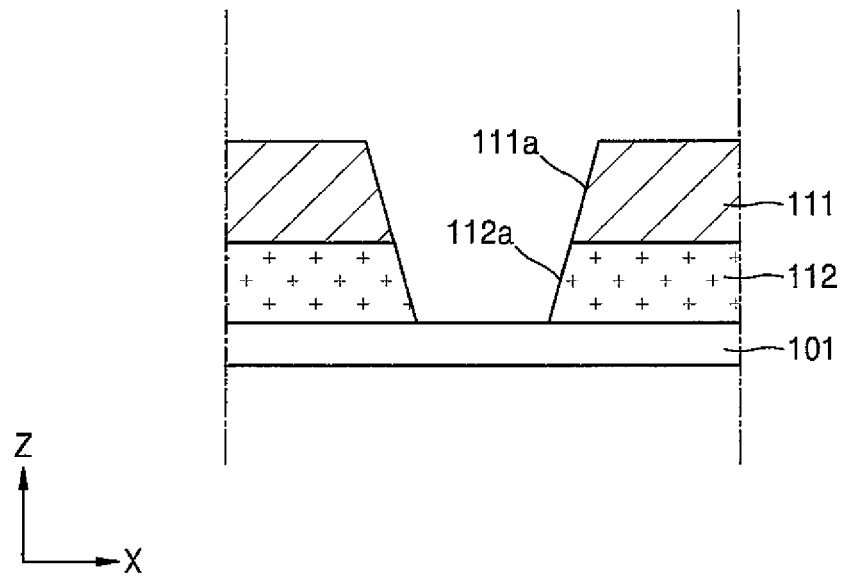

According to some example embodiments, when the first adhesive layer 112 is formed between the substrate 101 and the first protective layer 111 as illustrated in FIG. 2, a removal area 112a may also be formed in the first adhesive layer 112, as illustrated in FIG. 5.

When the first laser beam LB1 is irradiated, a portion of the upper surface of the substrate 101 may not be removed. Also, according to some example embodiments, a very small portion of the upper surface of the substrate 101 may be removed.

When the first laser beam LB1 is irradiated onto the first protective layer 111 such that the focus F of the first laser beam LB1 is distanced from the surface of the first protective layer 111, as described with reference to FIG. 3B, the removal area 111a of the first protective layer 111 may be formed wide, and effects of the first laser beam LB1 on the substrate 101 may be reduced or prevented because energy received per unit area of the first protective layer 111 is decreased.

Figure 6:
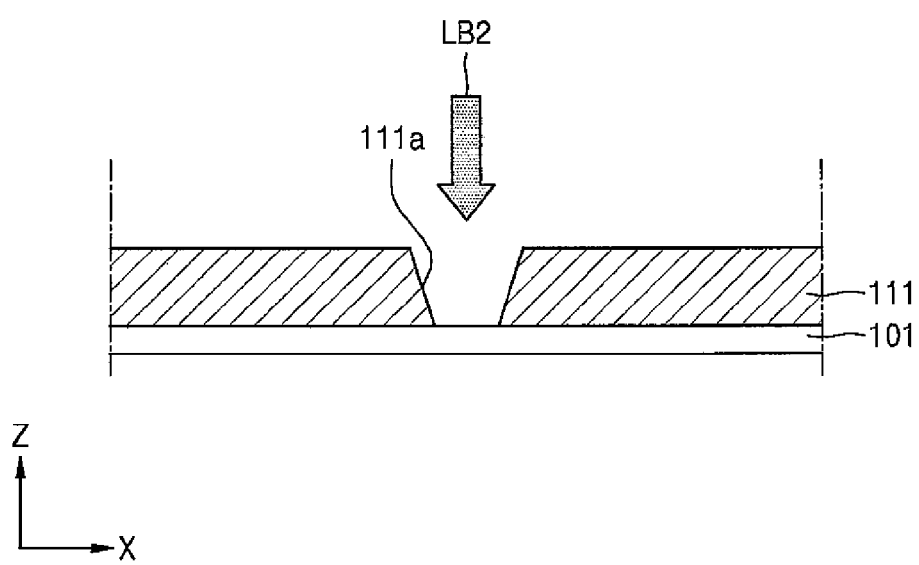

Then, as illustrated in FIG. 6, a second laser beam LB2 is irradiated toward the removal area 111a and correspondingly to the removal area 111a. The second laser beam LB2 may be various types. For example, the second laser beam LB2 may be a pulse laser beam having a pulse width of femto seconds to hundreds of femto seconds.

When the second laser beam LB2 is a pulse laser beam having a pulse width of femto seconds to hundreds of femto seconds, heat damage to the substrate 101 may be reduced or prevented when the second laser beam LB2 is irradiated on the substrate 101.

Figure 7:
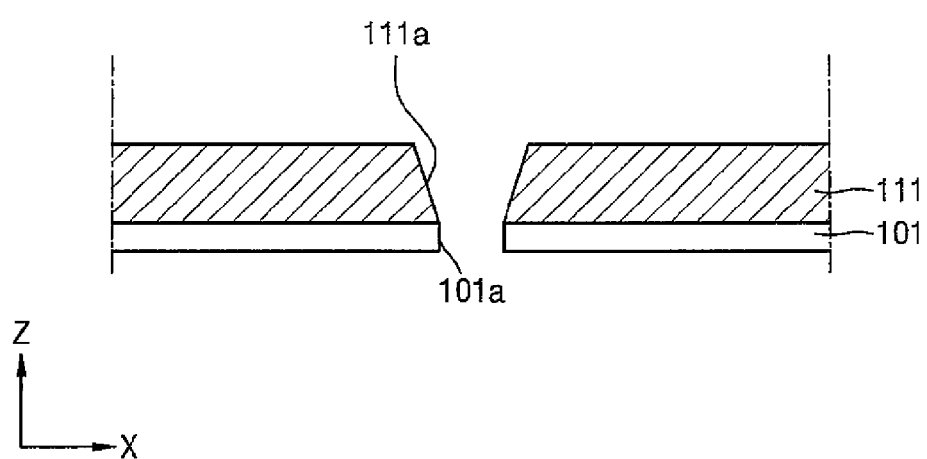

A cutting area 101a is formed on the substrate 101 by irradiating the second laser beam LB2, as illustrated in FIG. 7. For example, the second laser beam LB2 may form the cutting area 101a by removing at least an area of the substrate 101, which overlaps the removal area 111a.

The substrate 101 may be cut into one or more areas via the cutting area 101a.

Figure 8:
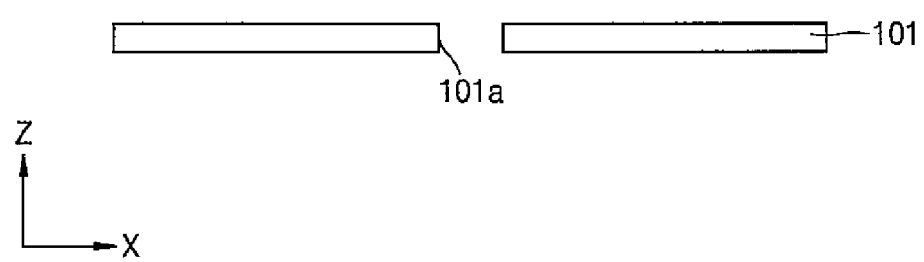

According to some example embodiments, the first protective layer 111 may be removed as illustrated in FIG. 8. When the first adhesive layer 112 is formed between the first protective layer 111 and the substrate 101, as illustrated in the example embodiment of FIG. 2, the first protective layer 111 may be relatively easily removed by removing the first adhesive layer 112. For example, when the first adhesive layer 112 includes a silicon-based material, the first adhesive layer 112 and the first protective layer 111 may be removed while reducing or preventing residues of the first adhesive layer 112 from contaminating the substrate 101.

The method of cutting a substrate according to the present example embodiment includes forming the cutting area 101a of the substrate 101 after forming the first protective layer 111 on the substrate 101. Via this process, the substrate 101 may be protected, and for example, when the substrate 101 is formed of a material sensitive to heat, such as an organic material, heat damage to the substrate 101 that may occur during the cutting process may be reduced. Also, according to some example embodiments, when the first protective layer 111 is removed after performing the cutting process such that the first protective layer 111 on the substrate 101 may be relatively easily removed, surface damage of the substrate 101 may be reduced.

Also, according to the present example embodiment, the first protective layer 111 is formed on a surface of the substrate 101, and then, the first laser beam LB1 is irradiated toward the first protective layer 111 to form the removal area 111a. Then, the second laser beam LB2 is irradiated toward the removal area 111a to remove an area of the substrate 101, which overlaps the removal area 111a, in order to form the cutting area 101a. Via this process, a precise cutting process with respect to the substrate 101 may be performed while minimizing or reducing damage of the substrate 101.

For example, according to some example embodiments, when irradiating the first laser beam LB1, the first laser beam LB1 may be defocused such that the focus F of the first laser beam LB1 is apart from the first protective layer 111, and thus, the removal area 111a may have a great width. Accordingly, when the second laser beam LB2 is irradiated correspondingly to the removal area 111a, the second laser beam LB2 may overlap the removal area 111a.

That is, when the second laser beam LB2 does not overlap the removal area 111a, the second laser beam LB2 becomes dislocated toward the first protective layer 111, and thus, it may not be easy to form the cutting area 101a on the substrate 101, and in order to prevent this, the intensity of the second laser beam LB2 may have to be excessively raised. However, according to the present example embodiment, the width of the removal area 111a may be easily enlarged, and thus, a margin of precision when the second laser beam LB2 is irradiated may be improved. Thus, the cutting area 101a may be easily formed.

Also, energy applied from the first laser beam LB1 per unit area of the first protective layer 111 may be reduced, and thus, heat damage to the first protective layer 111 and the substrate 101 may be minimized, prevented, or reduced.

FIGS. 9 through 14 are views for describing a method of cutting the substrate 101, according to another example embodiment.

Figure 9:
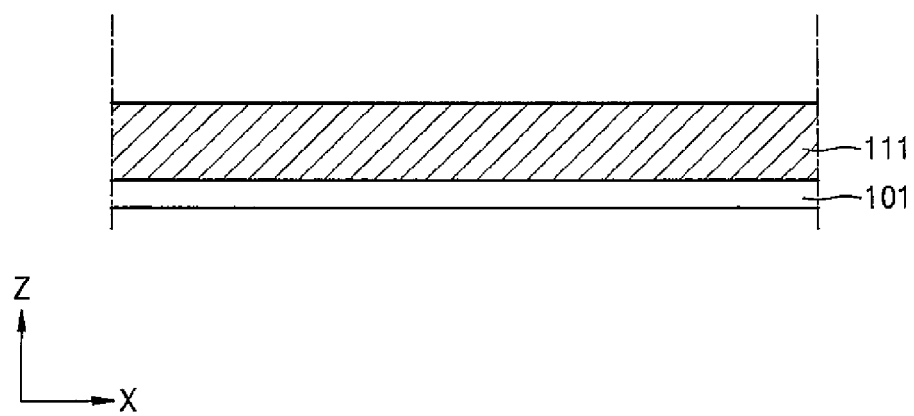
FIGS. 9 through 14 are views for describing a method of cutting a substrate, according to another example embodiment of the present invention.

First, referring to FIG. 9, the first protective layer 111 is formed on a surface of the substrate 101. For example, the first protective layer 111 may be formed on an upper surface of the substrate 101.

The substrate 101 and the first protective layer 111 are the same as the substrate 101 and the first protective layer 111 described in the above example embodiment, and thus, some repetitive detailed description may be omitted. Also, according to some example embodiments, the first adhesive layer 112 may further be included between the substrate 101 and the first protective layer 111, as illustrated in FIG. 2.

Figure 10:
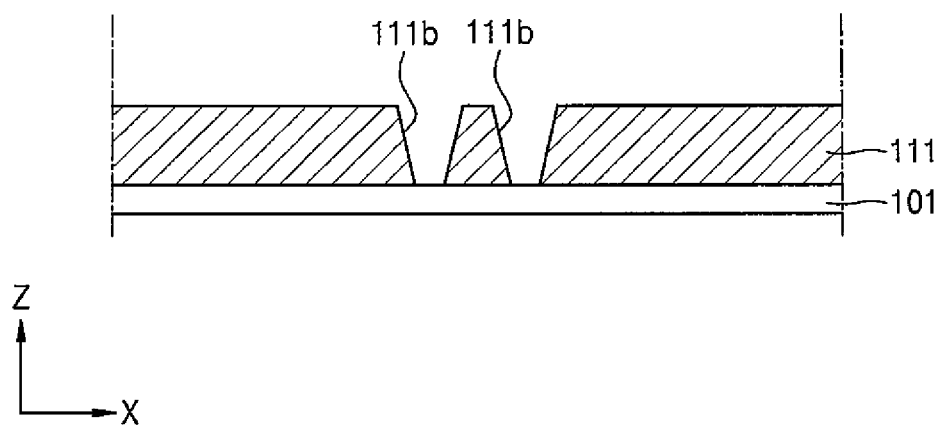

Then, referring to FIG. 10, a plurality of preliminary removal areas 111b are formed on the first protective layer 111. According to some example embodiments, two preliminary removal areas 111b may be formed to be spaced apart from each other on the first protective layer 111.

For example, the plurality of preliminary removal areas 111b may be formed by irradiating a preliminary first laser beam a plurality of times toward a surface of the first protective layer 111, the surface being opposite to a surface of the first protective layer 111 that faces the substrate 101. The plurality of preliminary removal areas 111b are formed to be spaced apart from one another and to have a width (e.g., a predetermined width). Also, the plurality of preliminary removal areas 111b may have a height (e.g., a predetermined height). For example, the preliminary removal areas 111b may have a height that is less than a thickness of the first protective layer 111. Accordingly, when the preliminary first laser beam is irradiated onto the first protective layer 111 to form the plurality of preliminary removal areas 111b, damage to the substrate 101 may be reduced or prevented.

According to some example embodiments, the preliminary removal areas 111b may have a height that corresponds to the total thickness of the first protective layer 111 as illustrated in FIG. 10.

Figure 11:
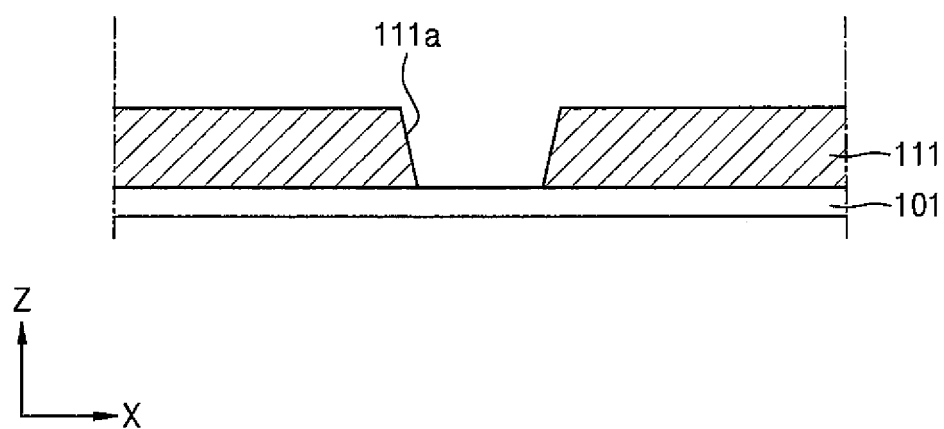

Then, the removal area 111a is formed to include the plurality of preliminary removal areas 111b and areas among (e.g., between) the plurality of preliminary removal areas 111b, as illustrated in FIG. 11. For example, the removal area 111a may be formed by irradiating a central first laser beam toward the surface that is opposite to the surface of the first protective layer 111 facing the substrate 101, and onto at least the areas among the plurality of preliminary removal areas 111b, which are apart from one another.

The removal area 111a may have a height corresponding to the total thickness of the first protective layer 111. According to some example embodiments, the height H1 of the removal area 111a may correspond to a portion of the thickness of the first protective layer 111.

The removal area 111a, which has a width, may have one or more widths. According to some example embodiments, the removal area 111a may have a width W2 and a width W1. The width W2 is a width of a portion of the removal area 111a that is adjacent to the substrate 101, and the width W1 is a width of a portion of the removal area 111a that is furthest from the substrate 101, wherein the width W2 may be less than the width W1.

According to some example embodiments, when the first adhesive layer 112 is formed between the substrate 101 and the first protective layer 111, as illustrated in FIG. 2, the removal area 111a may also be formed on the first adhesive layer 112.

When the first laser beam LB1 is irradiated, a portion of the upper surface of the substrate 101 may not be removed. Also, according to some example embodiments, a very small portion of the upper surface of the substrate 101 may be removed.

The preliminary first laser beam and the central first laser beam may be various types of laser beams.

According to some example embodiments, the preliminary first laser beam and the central first laser beam may be a type having low transmittance with respect to the first protective layer 111. Accordingly, when the first laser beam LB1 is irradiated onto the first protective layer 111, the distribution of the first laser beam LB1 in a direction that is perpendicular to a thickness direction of the first protective layer 111 may be reduced.

According to some example embodiments, a focus F of at least one of the preliminary first laser beam and the central first laser beam may be defocused to be apart from a surface of the first protective layer 111.

As described with reference to FIG. 3B, when the first laser beam LB1 is irradiated onto the first protective layer 111 such that the focus F of the first laser beam LB1 is apart from the surface of the first protective layer 111, the removal area 111a of the first protective layer 111 may be relatively large and the energy that is applied per unit area of the first protective layer 111 may be decreased, thereby reducing or preventing the effect of the first laser beam LB1 on the substrate 101.

Figure 12:
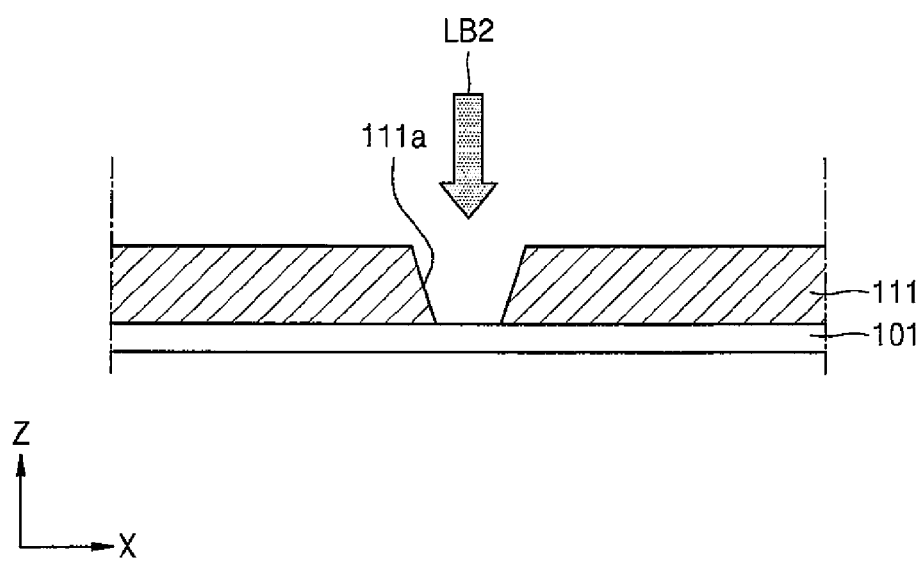

Thereafter, the second laser beam LB2 is irradiated toward the removal area 111a and correspondingly to the removal area 111a, as illustrated in FIG. 12. The second laser beam LB2 may be various types. For example, the second laser beam LB2 may be a pulse laser beam having a pulse of femto seconds to hundreds of femto seconds.

Figure 13:
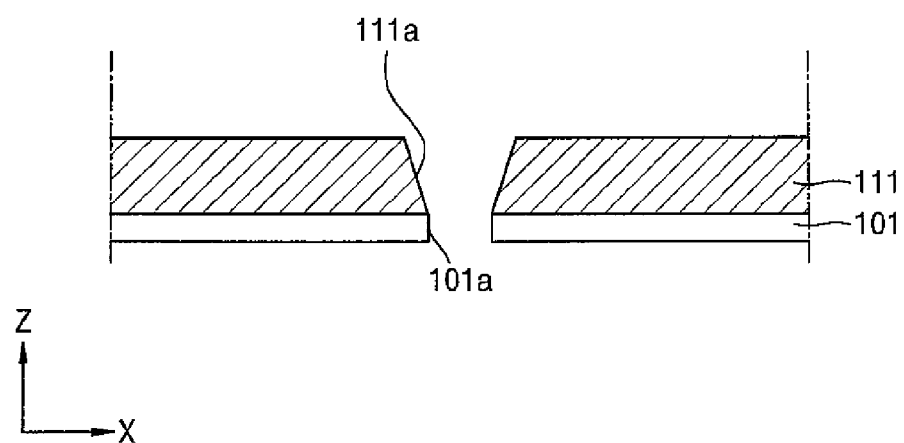

The cutting area 101a is formed on the substrate 101 by irradiating the second laser beam LB2, as illustrated in FIG. 13. For example, the second laser beam LB2 may remove at least an area of the substrate 101, which overlaps the removal area 111a, in order to form the cutting area 101a.

Via the cutting area 101a, the substrate 101 may be cut into one or more areas.

Figure 14:
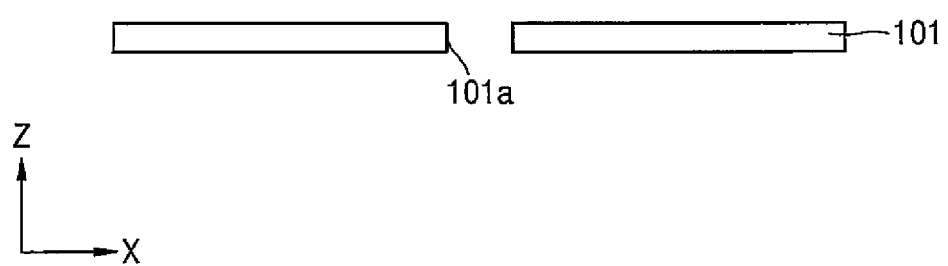

According to some example embodiments, the first protective layer 111 may be removed as illustrated in FIG. 14.

According to the method of cutting the substrate in the present example embodiment, after the first protective layer 111 is formed on the substrate 101, the cutting area 101a is formed on the substrate 101. Accordingly, the substrate 101 may be protected from damage, and for example, when the substrate 101 is formed of a material sensitive to heat, such as an organic material, thermal damage that may occur to the substrate 101 during the cutting process may be reduced. Also, according to some example embodiments, if the first protective layer 111 is removed after the cutting process is performed such that the first protective layer 111 may be easily removed from the substrate 101, the surface damage of the substrate 101 may be reduced.

Also, according to the present example embodiment, the preliminary first laser beam is irradiated toward the first protective layer 111 to form the plurality of distanced preliminary removal areas, after the first protective layer 111 is formed on a surface of the substrate 101. Then, the central first laser beam is irradiated correspondingly to at least areas among the preliminary removal areas, to form the removal area 111a corresponding to the preliminary removal areas and the areas thereamong. Accordingly, damage to the substrate 101 may be reduced or prevented, while the removal area 111a having a great width may be easily formed.

After the removal area 111a is formed, the second laser beam LB2 is irradiated toward the removal area 111a to remove an area of the substrate 101, which overlaps the removal area 111a, so that the cutting area 101a is formed. Accordingly, damage to the substrate 101 may be minimized or reduced, and a precise cutting process may be performed on the substrate 101.

Also, according to the present example embodiment, since the width of the removal area 111a may be easily enlarged, a precision margin is improved when the second laser beam LB2 is irradiated, and thus, the cutting area 101a may be easily formed.

FIGS. 15 through 20 are views for describing a method of cutting the substrate 101, according to another example embodiment.

Figure 15:
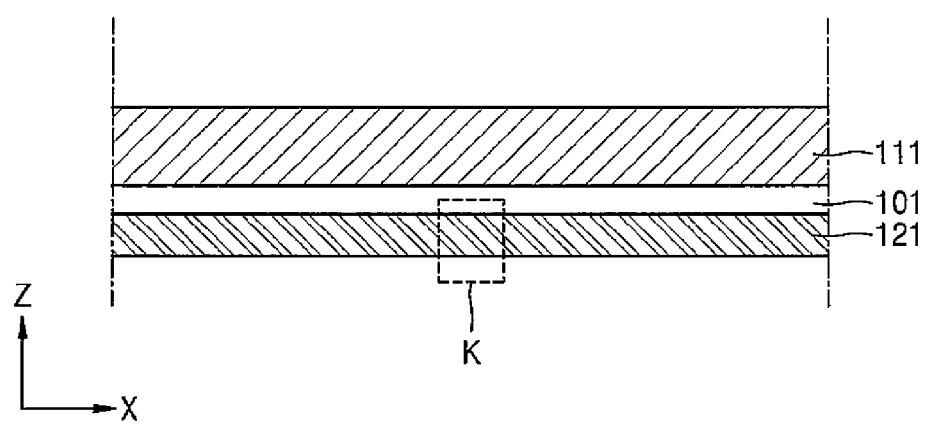
FIGS. 15 through 20 are views for describing a method of cutting a substrate, according to another example embodiment of the present invention t.

First, referring to FIG. 15, the first protective layer 111 is formed on a surface of the substrate 101. For example, the first protective layer 111 may be formed on an upper surface of the substrate 101.

Materials forming the substrate 101 and the first protective layer 111 are the same as the materials described in the example embodiment of FIG. 1, and thus, some repetitive detailed descriptions will be omitted.

A second protective layer 121 is formed on a surface of the substrate 101, the surface being opposite to a surface of the substrate 101, which faces the first protective layer 111. The second protective layer 121 may protect a surface of the substrate 101. The second protective layer 121 may be formed of various materials. For example, the second protective layer 121 may be formed of one or more insulating materials.

According to some example embodiments, the second protective layer 121 may be attached to the substrate 101 as a film type. For example, the second protective layer 121 may be a film containing an organic material. For example, the second protective layer 121 may be a PET film.

According to some example embodiments, the second protective layer 121 may include at least one selected from the group consisting of PC, PPT, PEN, COP, COC, PMMA, PI, PAR, PES, PEI, silicon resins, fluorine resins, and modified epoxy resins.

Figure 16:
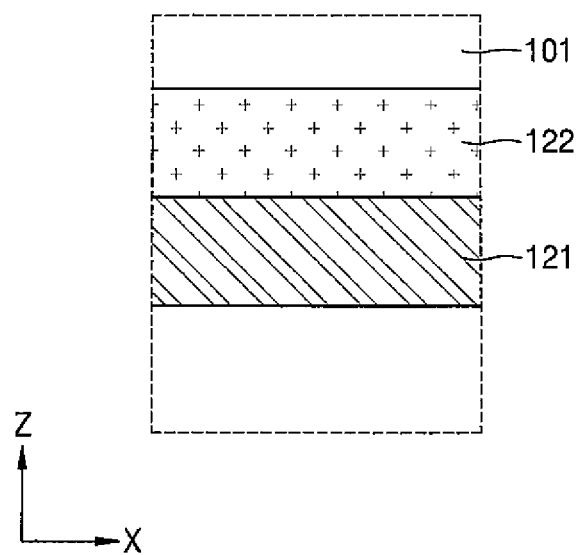

According to some example embodiments, as illustrated in FIG. 16, a second adhesive layer 122 may further be formed between the substrate 101 and the second protective layer 121. FIG. 16 is an enlarged view of region K of FIG. 15.

The second protective layer 121 may be attached to the surface of the substrate 101 via the second adhesive layer 122.

The second adhesive layer 122 may include various adhesive materials.

According to some example embodiments, the second adhesive layer 122 may contain an acryl-based material, and via this, the second protective layer 121 may not be easily separated from the substrate 101 in a sequential process to protect the substrate 101.

Also, although not shown, the first adhesive layer 112 may further be formed between the substrate 101 and the first protective layer 111, according to some example embodiments.

A thickness of the second protective layer 121 may be less than a thickness of the first protective layer 111. According to some example embodiments, the first protective layer 111 is an area onto which a laser beam is directly irradiated during a cutting process, and thus, the first protective layer 111 may be formed to be thick to prevent a modification of the substrate 101 due to heat and to protect the substrate 101. The second protective layer 121 corresponds to an area which is distanced farther away from the laser beam than the substrate 101, and thus, the need to increase the thickness of the second protective layer 121 in order to prevent the modification due to the laser beam is reduced.

Figure 17:
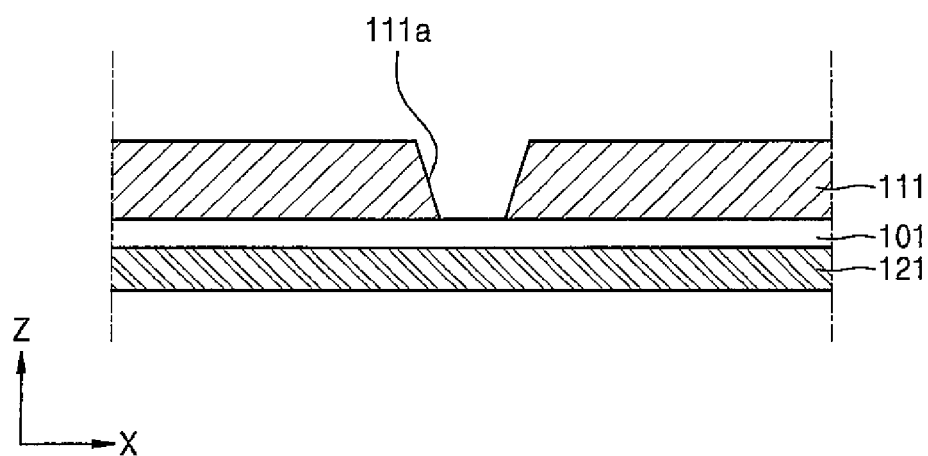

Then, referring to FIG. 17, the first laser beam is irradiated toward the first protective layer 111 to form the removal area 111a where a portion of the first protective layer 111 is removed.

The process of forming the removal area 111a may be performed by using the method described with reference to FIGS. 3A and 3B. Also, according to some example embodiments, the removal area 111a may be formed by the process described with reference to FIGS. 10 and 11.

The removal area 111a may have a height corresponding to the total thickness of the first protective layer 111. According to some example embodiments, a height of the removal area 111a may correspond to a portion of the thickness of the first protective layer 111.

Figure 18:
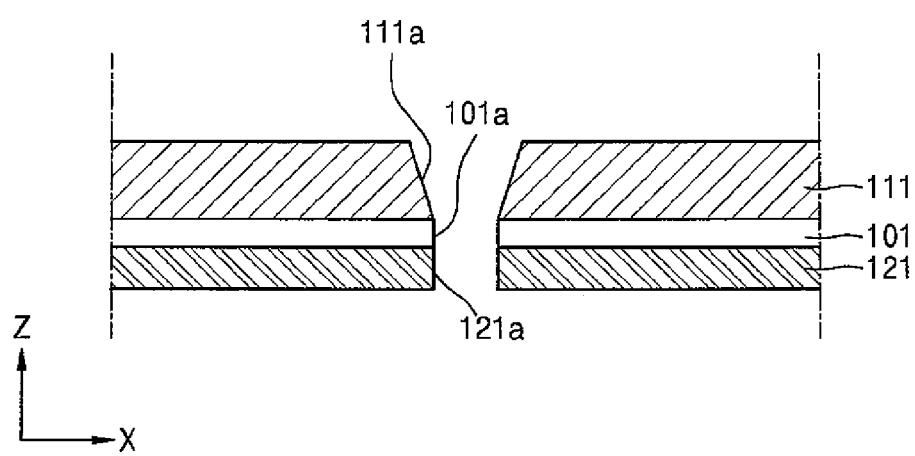

Then, as illustrated in FIG. 18, the second laser beam is irradiated toward the removal area 111a and correspondingly to the removal area 111a, to form the cutting area 101a on the substrate 101. For example, the second laser beam may form the cutting area 101a by removing at least an area of the substrate 101, which overlaps the removal area 111a.

Also, a cutting area 121*a* is formed on an area of the second protective layer 121, which overlaps the cutting area 101*a* of the substrate 101.

Figure 19:
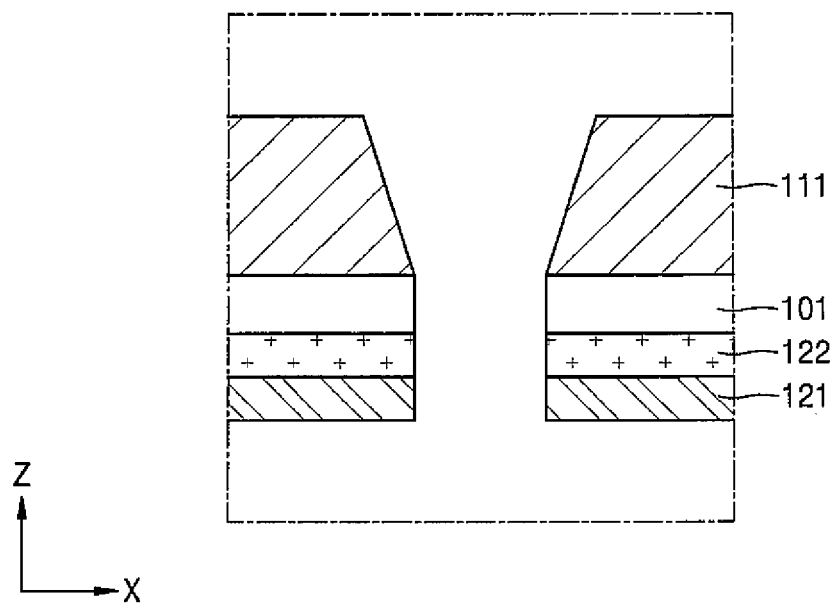

According to some example embodiments, when the second adhesive layer 122 is arranged between the substrate 101 and the second protective layer 121, as described with reference to FIG. 16, the cutting area 121*a* is also formed on the second adhesive layer 122, as illustrated in FIG. 19.

The substrate 101 may be cut into one or more areas via the cutting area 101*a*.

Figure 20:
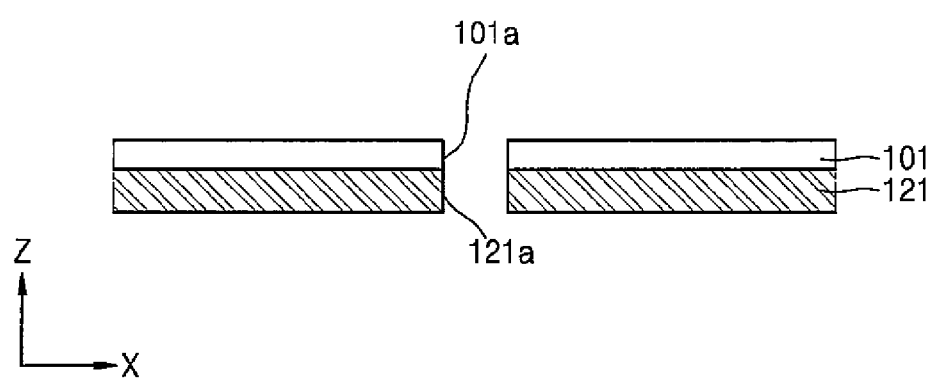

According to some example embodiments, the first protective layer 111 may be removed, as illustrated in FIG. 20.

The method of cutting the substrate according to the present example embodiment includes forming the cutting area 101*a* on the substrate 101 after forming the first protective layer 111 on the substrate 101. Accordingly, the substrate 101 may be easily protected, and in particular, when the substrate 101 is formed of a material sensitive to heat, such as an organic material, unnecessary heat damage which may occur to the substrate 101 during the cutting process may be reduced. Also, according to some example embodiments, if the first protective layer 111 is removed after the cutting process is performed such that the first protective layer 111 may be relatively easily removed from the substrate 101, surface damage to the substrate 101 may be reduced.

Also, according to the present example embodiment, the second protective layer 121 is formed on the surface that is opposite to the surface of the substrate 101, which faces the first protective layer 111, in order to effectively protect the substrate 101. For example, when the substrate 101 is formed of a flexible material such as plastic, shocks, heat, etc., which may be applied to the substrate 101 during the cutting process of the substrate 101 may be alleviated to reduce or prevent damage to the substrate 101.

Also, after the removal area 111*a* is formed by irradiating the first laser beam toward the first protective layer 111, the second laser beam is sequentially irradiated toward the removal area 111*a* to remove an area of the substrate 101, which overlaps the removal area 111*a*, in order to form the cutting area 101*a*. Accordingly, damage to the substrate 101 may be minimized and a precise cutting process with respect to the substrate 101 may be performed.

For example, according to some example embodiments, when the first laser beam is irradiated, the focus F of the first laser beam may be defocused to be apart from the first protective layer 111, so that a width of the removal area 111*a* may become great. Accordingly, when the second laser beam is irradiated correspondingly to the removal area 111*a*, the second laser beam may easily overlap the removal area 111*a*.

FIGS. 21 through 28 are views for describing a method of manufacturing a display apparatus 200, according to an example embodiment.

Figure 21:
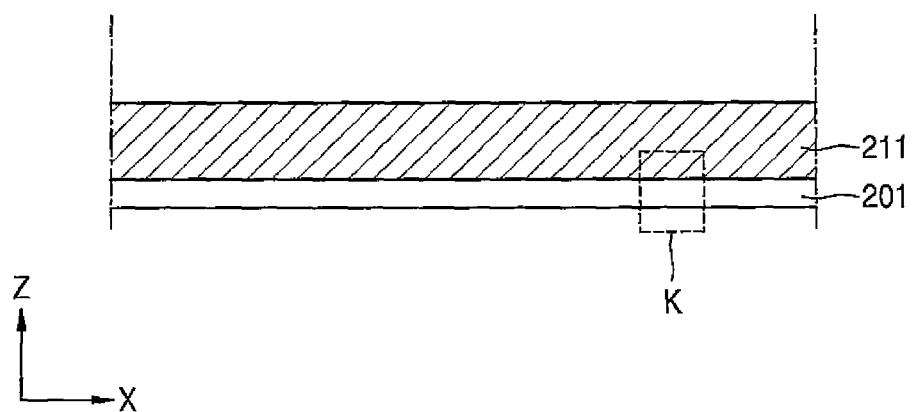
FIGS. 21 through 28 are views for describing a method of manufacturing a display apparatus, according to an example embodiment of the present invention.

First, referring to FIG. 21, a first protective layer 211 is formed on a surface of the substrate 201. In detail, the first protective layer 211 is formed on an upper surface of the substrate 201.

The substrate 201 may include various materials. For example, the substrate 201 may be formed of glass, metal, or other organic materials.

According to some example embodiments, the substrate 201 may be formed of flexible materials. For example, the substrate 201 may be formed to be easily bent, curved, folded, or wound.

According to some example embodiments, the substrate 201 may be formed of ultrathin glass, metal, or plastic. For example, when the substrate 201 is formed, of plastic, the substrate 201 may be formed of PI. However, this is example, and various materials may be used to form the substrate 201.

The first protective layer 211 may be formed on a surface of the substrate 201 to protect the surface of the substrate 201. The first protective layer 211 may be formed of various materials. For example, the first protective layer 211 may be formed of insulating materials.

According to some example embodiments, the first protective layer 211 may be attached to the substrate 201 as a film type. For example, the first protective layer 211 may be a film containing an organic material. For example, the first protective layer 211 may be a PET film.

Figure 22:
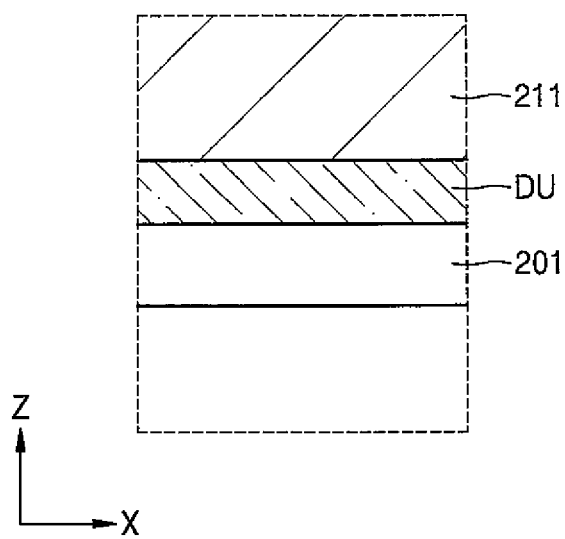
Figure 23:
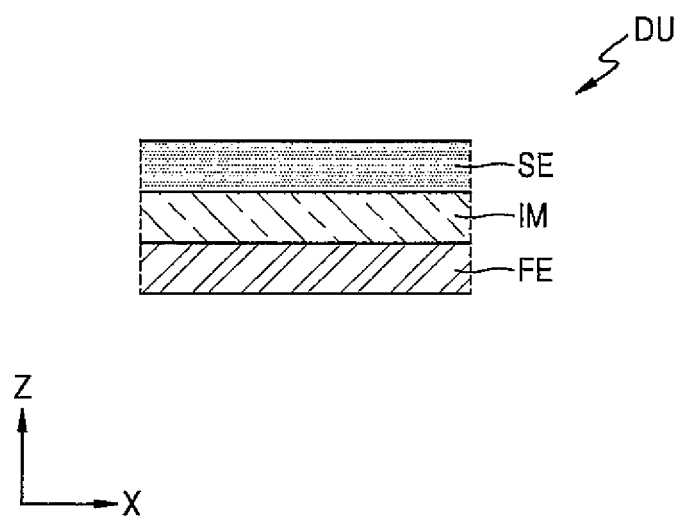

FIG. 22 is an enlarged view of region K of FIG. 21, and FIG. 23 is a view of an example structure of a display unit DU of FIG. 22.

Referring to FIG. 22, the display unit DU is formed on a substrate 201. The display unit DU may be various types configured to produce visible rays. For example, the display unit DU may include a first electrode FE, a second electrode SE, and an intermediate layer IM, as illustrated in FIG. 23.

The intermediate layer IM is arranged between the first electrode FE and the second electrode SE.

The first electrode FE may be formed of various materials. That is, the first electrode FE may include, for example, at least one selected from the group consisting of transparent conductive oxide, such as indium tin oxide (ITO), indium zinc oxide (IZO), zinc oxide (ZnO), indium oxide ($In_2O_3$), indium gallium oxide (IGO), and aluminum zinc oxide (AZO). Also, the first electrode FE may include a metal having a high reflectivity, such as Ag.

The intermediate layer IM may include an organic emission layer, and the organic emission layer may be formed of a low molecular weight organic material or a high molecular weight organic material. According to some example embodiments, in addition to the organic emission layer, the intermediate layer IM may further include at least one selected from the group consisting of a hole injection layer, a hole transport layer, an electron transport layer, and an electron injection layer.

The second electrode SE may be formed of various conductive materials. For example, the second electrode SE may include Li, Ca, LiF, Al, Mg, or Ag. The second electrode SE may be formed as a single layer or multiple layers including at least one of Li, Ca, LiF, Al, Mg, and Ag, and the second electrode SE may also include an alloy containing at least two of Li, Ca, LiF, Al, Mg, and Ag.

Although not shown, the display unit DU may include a circuit unit electrically connected to the first electrode FE or the second electrode SE. For example, the display unit DU may include at least one thin film transistor.

The first protective layer 211 may cover the display unit DU, as illustrated in FIG. 22.

According to some example embodiments, the first protective layer 211 may not cover the display unit DU. That is, the first protective layer 211 may be formed only on a certain area of the substrate 201, that is, an area including an area in which the cutting process of the substrate 210 is to be performed, rather than the entire area thereof, and may not cover the display unit DU.

Figure 24A:
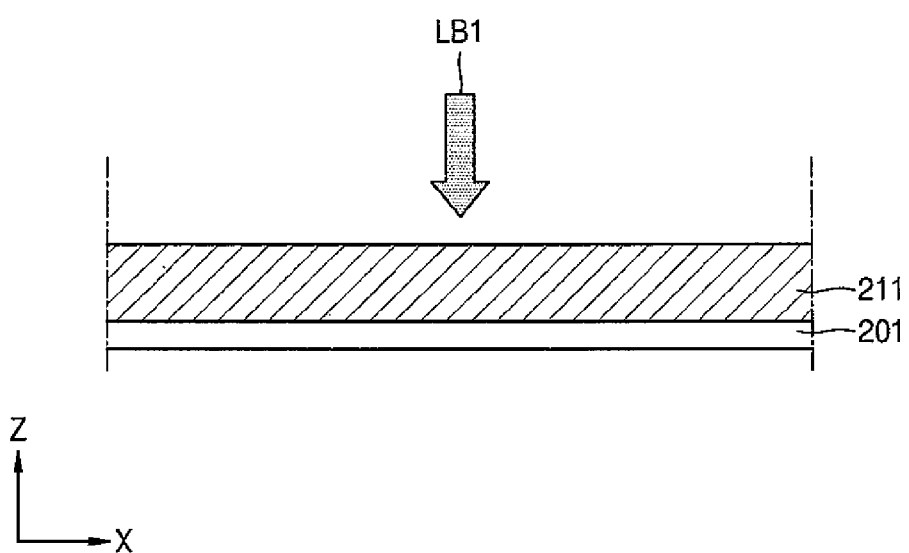

Then, referring to FIG. 24A, the first laser beam LB1 is irradiated toward the first protective layer 211. For example, the first laser beam LB1 is irradiated toward a surface of the first protective layer 211, the surface being opposite to a surface of the first protective layer 211, which faces the substrate 201.

The first laser beam LB1 may be various types of laser beams.

According to some example embodiments, the first laser beam LB1 may be a type which has low transmittance with respect to the first protective layer 211. Accordingly, when the first laser beam LB1 is irradiated onto the first protective layer 211, the distribution of the first laser beam LB1 in a direction (an X-axis direction of FIG. 24A) that is perpendicular to a thickness direction of the first protective layer 211 may be reduced.

Figure 24B:
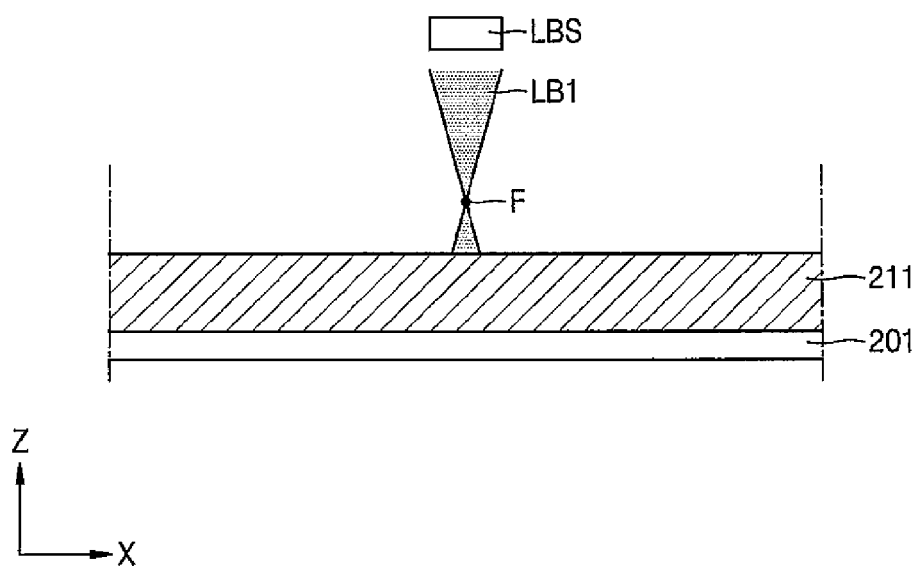

According to some example embodiments, as illustrated in FIG. 24B, when the first laser beam LB1 is irradiated toward a surface of the first protective layer 211, the first laser beam irradiation device LBS may be controlled to irradiate the first laser beam LB1 such that a focus F of the first laser beam LB1 is apart from the surface of the first protective layer 211. For example, an optical member of the first laser beam irradiation device LBS may be controlled.

Referring to FIG. 24B, the focus F of the first laser beam LB1 is spaced apart from the surface of the first protective layer 211. That is, the first laser beam LB1 may not be a focused beam but may be a defocused beam. When the first laser beam LB1 is irradiated onto the first protective layer 211 such that the focus F of the first laser beam LB1 is apart (e.g., separated by a distance) from the surface of the first protective layer 211, a large area of the surface of the first protective layer 211 may be irradiated by the first laser beam LB1, and the energy applied per unit area of the first protective layer 211 may be reduced.

Figure 25:
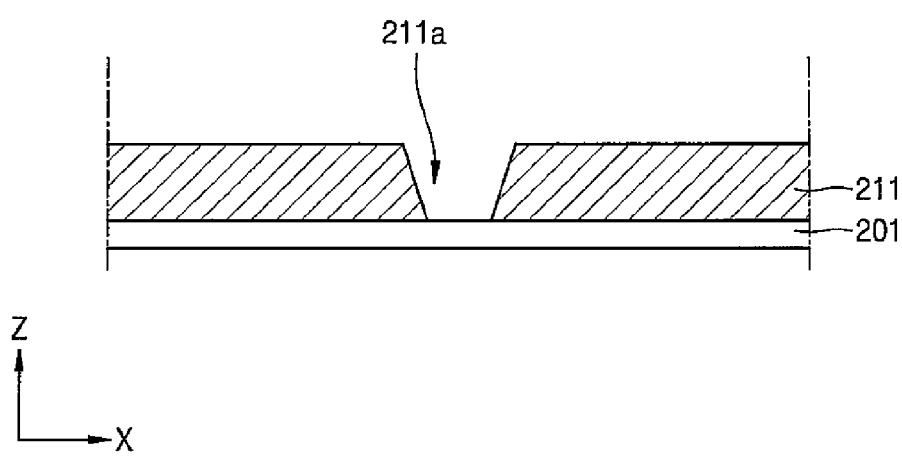

As illustrated in FIG. 25, the removal area 211a is formed where a portion of the first protective layer 211 is removed, by irradiating the first laser beam LB1 toward the first protective layer 111.

The removal area 211a may have a height corresponding to the total thickness of the first protective layer 211. According to some example embodiments, the height of the removal area 211a may correspond to a portion of the thickness of the first protective layer 211.

The removal area 211a has a width, and the removal area 211a may have one or more widths. According to some example embodiments, a width of an area of the removal area 211a that is adjacent to the substrate 201 may be different from a width of an area of the removal area 211a that is far from the substrate 201. The width of the area of the removal area 211a that is adjacent to the substrate 201 may be smaller than the width of the area of the removal area 211a that is far from the substrate 201.

When the first laser beam LB1 is irradiated, a portion of the upper surface of the substrate 201 may not be removed. Also, according to some example embodiments, a very small portion of the upper surface of the substrate 201 may be removed.

As illustrated in FIG. 24B, when the first laser beam LB1 is irradiated onto the first protective layer 211 such that the focus F of the first laser beam LB1 is apart (e.g., separated by a distance) from the surface of the first protective layer 211, the removal area 211a of the first protective layer 211 may be formed to have a great width, and the energy applied per unit area of the first protective layer 211 may be reduced in order to reduce or prevent the effect of the first laser beam LB1 on the substrate 201.

The removal area 211a and the display unit DU may be spaced apart from each other.

According to some example embodiments, the removal area 211a may at least partially overlap the display unit DU.

Figure 26:
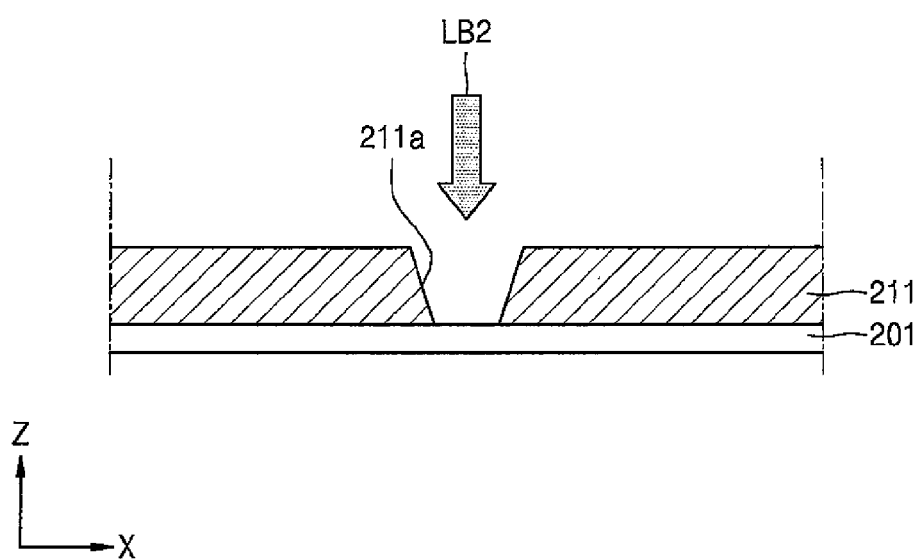

Then, the second laser beam LB2 is irradiated toward the removal area 211a and correspondingly to the removal area 211a, as illustrated in FIG. 26. The second laser beam LB2 may be various types. For example, the second laser beam LB2 may be a pulse laser beam having a pulse of femto seconds to hundreds of femto seconds.

When the second laser beam LB2 is a pulse laser beam having a pulse of femto seconds to hundreds of femto seconds, heat damage to the substrate 201 may be reduced or prevented when the second laser beam LB2 is irradiated onto the substrate 201.

Figure 27:
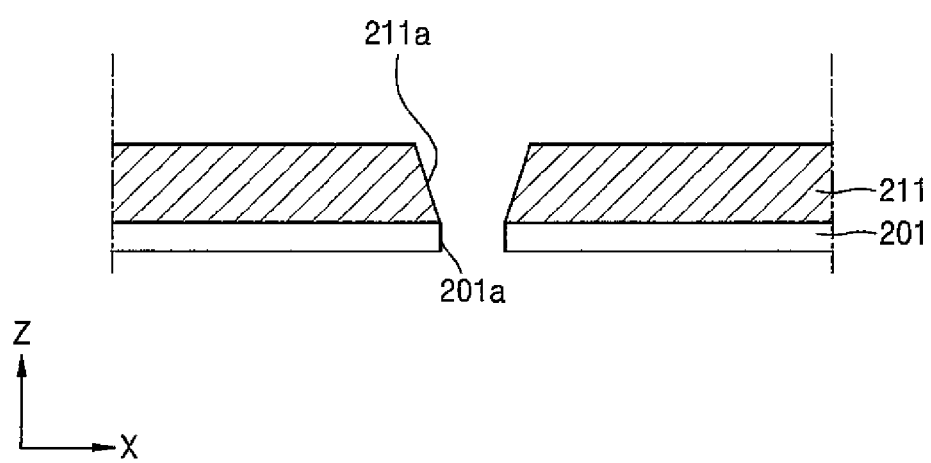

The cutting area 201a is formed on the substrate 201 by irradiating the second laser beam LB2, as illustrated in FIG. 27. For example, the second laser beam LB2 removes at least an area of the substrate 201, which overlaps the removal area 211a, to form the cutting area 201a.

The cutting area 201a may be spaced apart from the display unit DU.

According to some example embodiments, the cutting area 201a may at least partially overlap the display unit DU.

Via the cutting area 201a, the substrate 201 may be cut into one or more areas. Also, ultimately, the display apparatus 200 having the substrate 201 and the display unit DU is manufactured. Based on the cutting area 201a, an area adjacent to the display apparatus 200 may be a dummy area 200D. According to some example embodiments, based on the cutting area 201a, another display apparatus, instead of the dummy area 200D, may be arranged on the area adjacent to the display apparatus 200.

Figure 28:
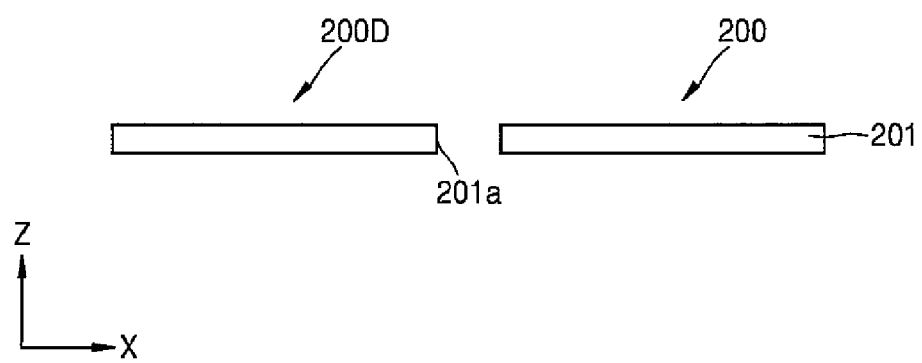

According to some example embodiments, the first protective layer 211 may be removed, as illustrated in FIG. 28.

When forming the removal area 211a, the process described with reference to FIGS. 10 and 11 may be used, according to some example embodiments.

The method of cutting the substrate according to the present example embodiment includes forming the cutting area 201a on the substrate 201 after forming the first protective layer 211 on the substrate 201. Accordingly, the substrate 201 may be easily protected, and when the substrate 201 is formed of a material sensitive to heat, such as an organic material, thermal damage which may occur to the substrate 201 during the cutting process may be reduced. Also, if the first protective layer 211 is removed after the cutting process is performed such that the first protective layer 211 may be easily removed from the substrate 201, the surface damage of the substrate 201 may be reduced. In addition, via this, the display unit DU may have less thermal damage or thermal effect, or the thermal damage or thermal effect on the display unit DU may be prevented.

Also, according to the present example embodiment, the first protective layer 211 is formed on a surface of the substrate 201, and then, the first laser beam LB1 is irradiated toward the first protective layer 211 to form the removal area 211a. Then, the second laser beam LB2 is irradiated toward the removal area 211a to remove an area of the substrate 201, which overlaps the removal area 211a, in order to form the cutting area 201a. Via this process, a precise cutting process with respect to the substrate 201 may be performed while minimizing damage of the substrate 201.

For example, according to some example embodiments, when the first laser beam LB1 is irradiated, the first laser beam LB1 may be defocused such that the focus F of the first laser beam LB1 is spaced apart from the first protective layer 211 so that the removal area 211a has a great width. By this, when the second laser beam LB2 is irradiated correspondingly to the removal area 211a, the second laser beam LB2 may easily overlap the removal area 211a.

Also, according to some example embodiments, when the removal area 211a is formed, the preliminary first laser beam may be irradiated to form the plurality of distanced preliminary removal areas. Then, the central first laser beam may be irradiated correspondingly to at least areas among the preliminary removal areas, to form the removal area 111a corresponding to the preliminary removal areas and the areas thereamong. Accordingly, damage to the substrate 201 may be reduced or prevented, while the removal area 211a having a great width may be easily formed.

When the second laser beam LB2 does not overlap the removal area 211a, the second laser beam LB2 becomes dislocated toward the first protective layer 211, and thus, it may not be easy to form the cutting area 201a on the substrate 201 in order to prevent this, the intensity of the second laser beam LB2 may have to be excessively raised. However, according to the present example embodiment, the width of the removal area 211a may be easily enlarged, and thus, a margin of precision when the second laser beam LB2 is irradiated may be improved so that the cutting area 201a may be easily formed.

Also, energy applied from the first laser beam LB1 per unit area of the first protective layer 211 may be reduced, and thus, heat damage to the first protective layer 211 and the substrate 201 may be minimized, reduced, or prevented.

FIGS. 29 through 36 are views for describing a method of manufacturing a the display apparatus 200, according to another example embodiment.

Figure 29:
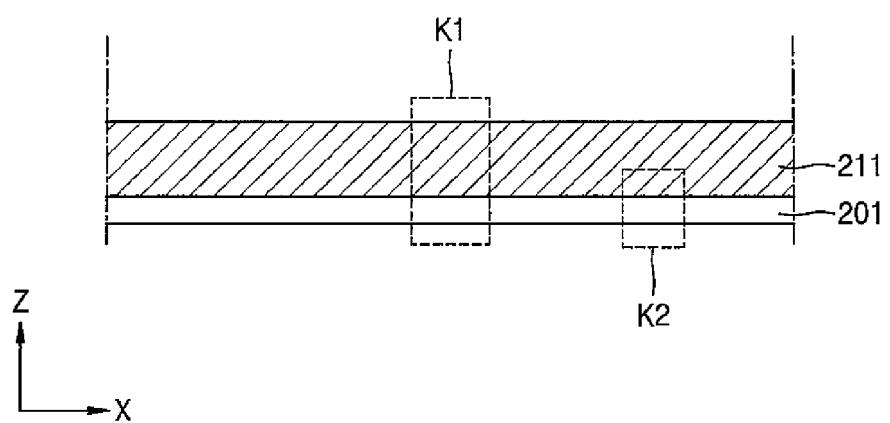
FIGS. 29 through 36 are views for describing a method of manufacturing a display apparatus, according to another example embodiment of the present invention.

First, referring to FIG. 29, the first protective layer 211 is formed on a surface of the substrate 201. In detail, the first protective layer 211 is formed on an upper surface of the substrate 201.

Specific materials forming the substrate 201 and the first protective layer 211 are the same as the materials in the example embodiment described with reference to FIG. 21, and thus, some detailed descriptions may be omitted.

Figure 30:
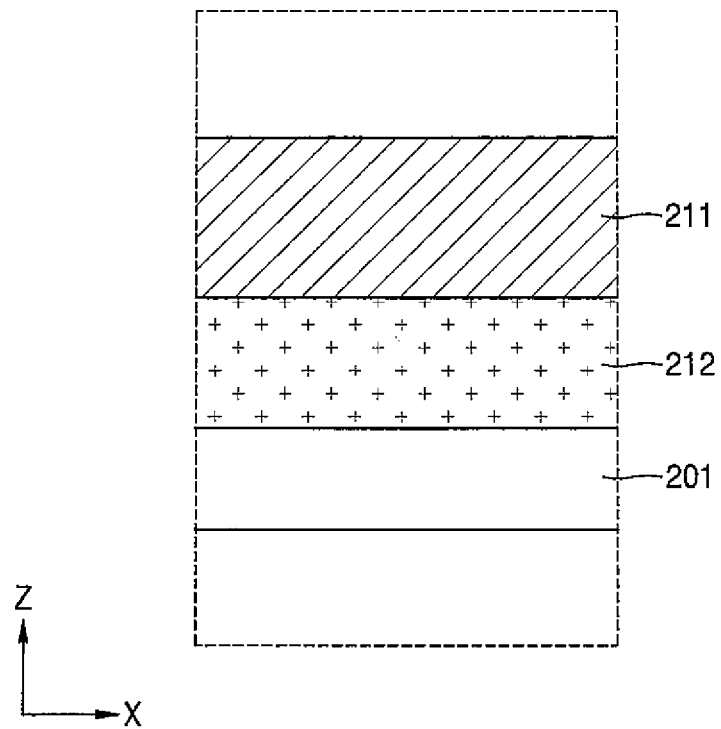

According to some example embodiments, the first adhesive layer 212 may further be included between the substrate 201 and the first protective layer 211, as illustrated in FIG. 30. FIG. 30 is an example enlarged view of K1 of FIG. 29.

The first protective layer 211 may be attached to a surface of the substrate 201 via the first adhesive layer 212.

The first adhesive layer 212 may include various adhesive materials.

According to some example embodiments, the first adhesive layer 212 may contain a silicon-based material, and via this, the first adhesive layer 212 may be removed from the substrate 201 in a sequential process, and thus, the first protective layer 211 may be removed from the substrate 201.

Figure 31:
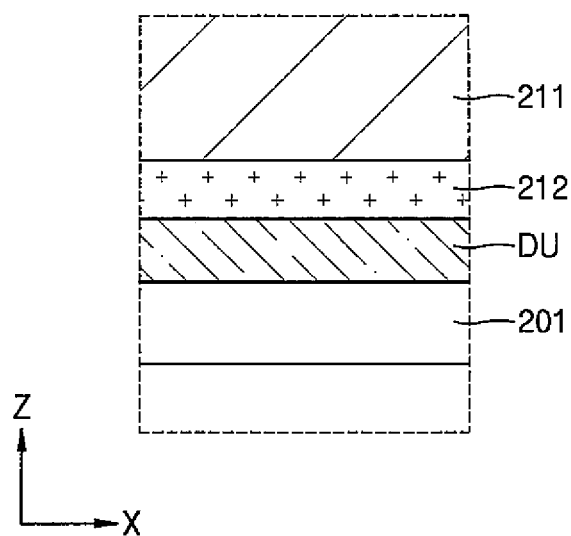
Figure 32:
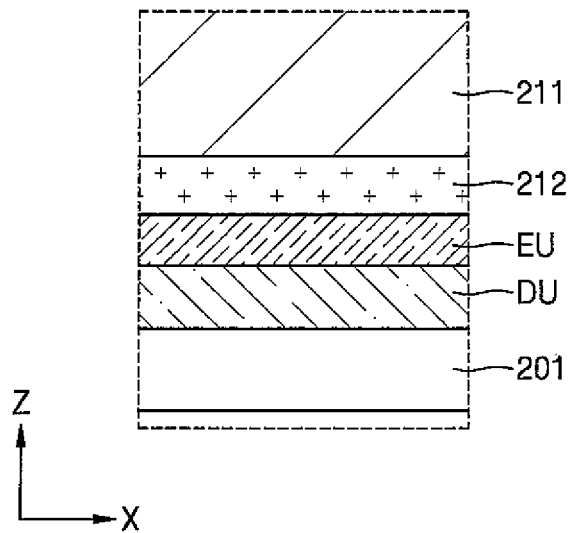

FIG. 31 is an enlarged view of K2 of FIG. 29, and FIG. 32 is a view of some example embodiments of FIG. 31.

Referring to FIG. 31, the display unit DU is formed on the substrate 201. The display unit DU may be various types configured to produce visible rays. Although not shown, the display unit DU may include the components described in FIG. 23.

The first protective layer 211 may cover the display unit DU, as illustrated in FIG. 22. Also, the first adhesive layer 212 may be arranged between the display unit DU and the first protective layer 211.

According to some example embodiments, the first protective layer 211 may not cover the display unit DU. That is, the first protective layer 211 may be formed only on an area of the substrate 201, that is, an area including an area on which the cutting process of the substrate 201 is to be performed, rather than the total surface of the substrate 201, and may not cover the display unit DU.

Also, as illustrated in FIG. 30, the display unit DU may not be arranged on the area of the first protective layer 211, on which the removal area 211a is to be formed in a sequential process. According to some example embodiments, the display unit DU may be formed to at least partially overlap the area of the first protective layer 211, on which the removal area 211a is to be formed in a sequential process.

Referring to FIG. 32, an encapsulation unit EU is formed on the display unit DU. In detail, the encapsulation unit EU is arranged between the display unit DU and the first adhesive layer 212.

The encapsulation unit EU may be formed on the display unit DU to prevent or reduce penetration of water or external air into the display unit DU. According to some example embodiments, the encapsulation unit EU may cover the display unit DU.

The encapsulation unit EU may be formed of various materials. For example, the encapsulation unit EU may include organic materials or inorganic materials.

According to some example embodiments, the encapsulation unit EU may include at least one organic layer or at least one inorganic layer. For example, the encapsulation unit EU may include a structure in which an organic layer and an inorganic layer are alternately stacked more than once.

Figure 33:
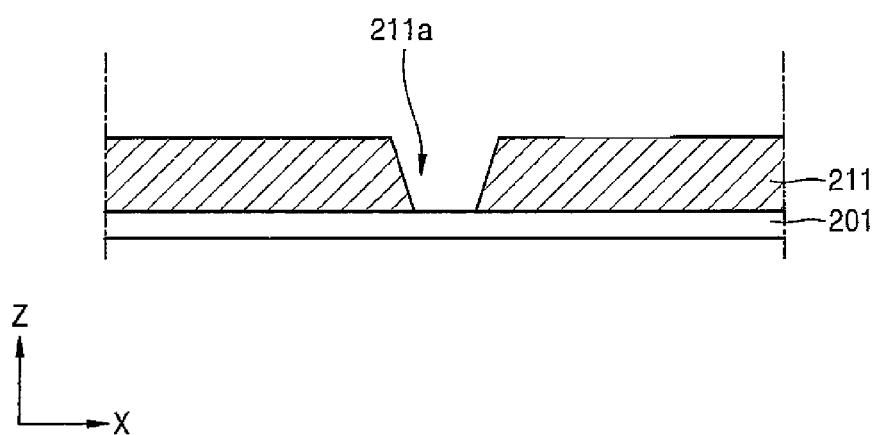

Then, referring to FIG. 33, a first laser beam is irradiated toward the first protective layer 211 to form the removal area 211a where a portion of the first protective layer 211 is removed.

The process of forming the removal area 211a may be performed by using the method described with reference to FIG. 24A or FIG. 24B. Also, according to some example embodiments, when forming the removal area 211a, the method described with reference to FIGS. 10 and 11 may be used.

The removal area 211a and the display unit DU may be spaced apart from each other. According to some example embodiments, the removal area 211a may at least partially overlap the display unit DU.

Figure 34:
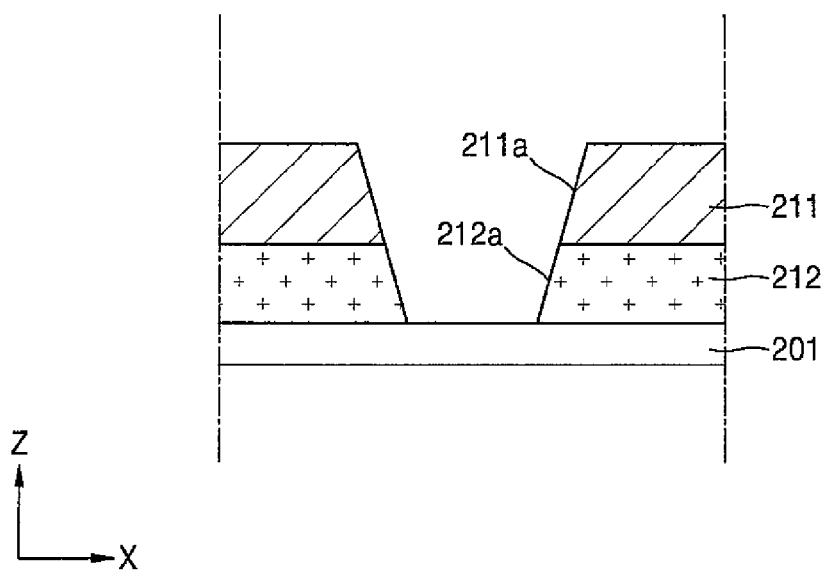

According to some example embodiments, when the first adhesive layer 212 is arranged between the substrate 201 and the first protective layer 211, as illustrated in FIG. 30, the removal area 212a may also be formed on the first adhesive layer 212 as illustrated in FIG. 34.

Figure 35:
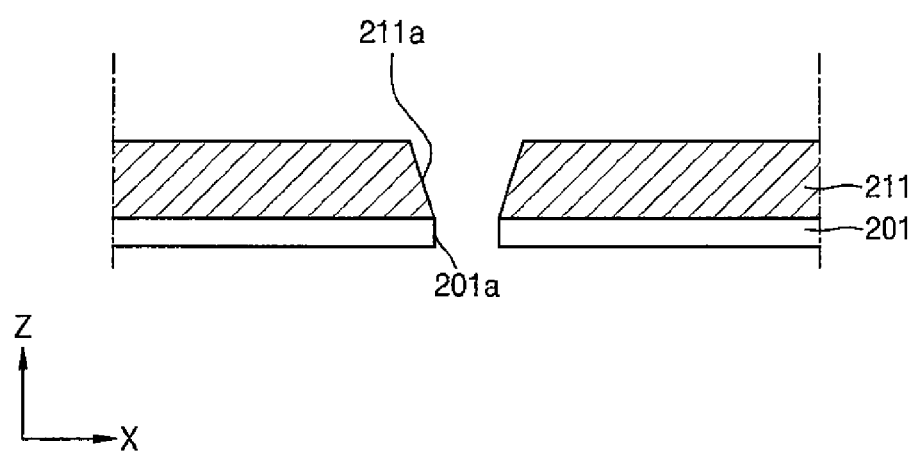

Then, as illustrated in FIG. 35, a second laser beam is irradiated toward the removal area 211a and correspondingly to the removal area 211a to form the cutting area 201a on the substrate 201. For example, the second laser beam may remove at least an area of the substrate 201, which overlaps the removal area 211a, to form the cutting area 201a.

The cutting area 201a may be spaced apart from the display unit DU. According to some example embodiments, the cutting area 201a may at least partially overlap the display unit DU.

Via the cutting area 201a, the substrate 201 may be cut into one or more areas. Also, ultimately, the display apparatus 200 having the substrate 201 and the display unit DU is manufactured. Based on the cutting area 201a, an area adjacent to the display apparatus 200 may be the dummy area 200D. According to some example embodiments, based on the cutting area 201a, another display apparatus, rather than the dummy area 200D, may be arranged on the area adjacent to the display apparatus 200.

Figure 36:
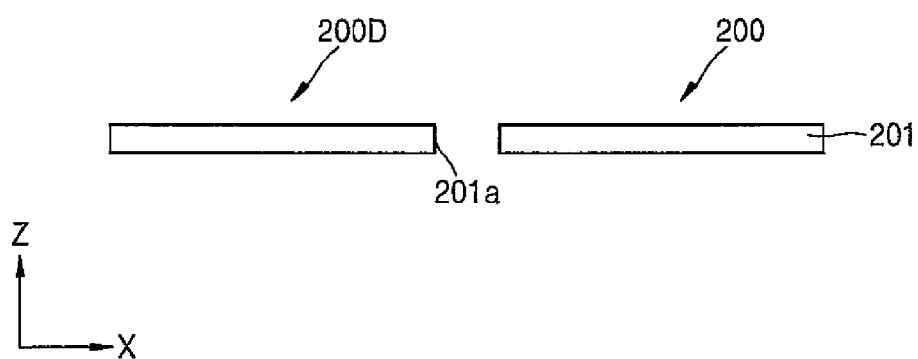

According to some example embodiments, the first protective layer 211 may be removed as illustrated in FIG. 36.

The method of cutting the substrate according to the present example embodiment includes forming the cutting area 201a on the substrate 201 after forming the first protective layer 211 on the substrate 201. Accordingly, the substrate 201 may be relatively easily protected, and when the substrate 201 is formed of a material sensitive to heat, such as an organic material, thermal damage that may occur to the substrate 201 during a cutting process may be reduced. Also, if the first protective layer 211 is removed after the cutting process is performed such that the first protective layer 211 may be easily removed from the substrate 201, the surface damage of the substrate 201 may be reduced. In addition, via this, the display unit DU may have less thermal damage or thermal effect, or the thermal damage or the thermal effect on the display unit DU may be prevented. Also, when the cutting process is performed when the first protective layer 211 covers the display unit DU, or the encapsulation unit E covering the display unit DU, damage to the display unit DU may be reduced or prevented.

Also, according to the present example embodiment, the first protective layer 211 is formed on a surface of the substrate 201, and then, the first laser beam LB1 is irradiated toward the first protective layer 211 to form the removal area 211a. Then, the second laser beam LB2 is irradiated toward the removal area 211a to remove an area of the substrate 201, which overlaps the removal area 211a, in order to form the cutting area 201a. Accordingly, a precise cutting process with respect to the substrate 201 may be performed while minimizing or reducing damage of the substrate 201.

FIGS. 37 through 43 are views for describing a method of manufacturing the display apparatus 200, according to another example embodiment.

Figure 37:
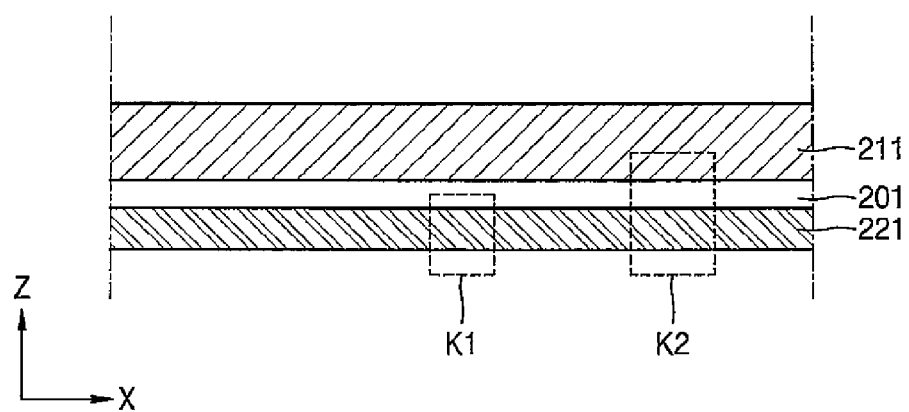
FIGS. 37 through 43 are views for describing a method of manufacturing a display apparatus, according to another example embodiment of the present invention.

First, referring to FIG. 37, the first protective layer 211 is formed on a surface of the substrate 201. In detail, the first protective layer 211 is formed on an upper surface of the substrate 201.

Specific materials included in the substrate 201 and the first protective layer 211 are the same as the materials described in FIG. 21, and thus, some detailed descriptions may be omitted.

The second protective layer 221 is formed on a surface of the substrate 201, which is opposite to a surface of the substrate 201 which is toward the first protective layer 211. The second protective layer 221 may protect a surface of the substrate 201. The second protective layer 221 may be formed of various materials. For example, the second protective layer 221 may be formed of insulating materials.

According to some example embodiments, the second protective layer 221 may be attached to the substrate 201 as a film type. For example, the second protective layer 221 may be a film containing an organic material. In detail, the second protective layer 221 may be a PET film.

Figure 38:
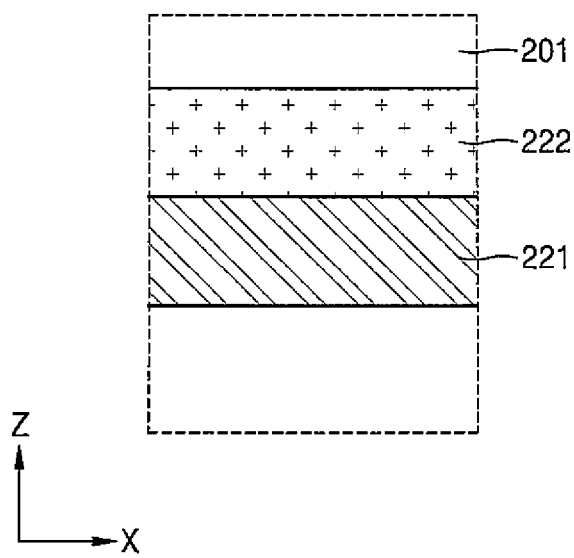

According to some example embodiments, the second adhesive layer 222 may further be included between the substrate 201 and the second protective layer 221 as illustrated in FIG. 38. FIG. 38 is an example enlarged view of K1 of FIG. 37. The second protective layer 221 may be attached to a surface of the substrate 201 via the second adhesive layer 222.

The second adhesive layer 222 may include various adhesive materials. According to some example embodiments, the second adhesive layer 222 may contain an acryl-based material, and via this, the second protective layer 221 may not be easily separated from the substrate 201 in a sequential process, in order to protect the substrate 201.

According to some example embodiments, the first adhesive layer 212 may further be included between the substrate 201 and the first protective layer 211, as described with reference to FIG. 30. Also, according to some example embodiments, the first adhesive layer 212 may be arranged between the first protective layer 211 and the display unit DU. According to another embodiment, the first adhesive layer 212 may be arranged between the first protective layer 211 and the encapsulation unit EU.

Figure 39:
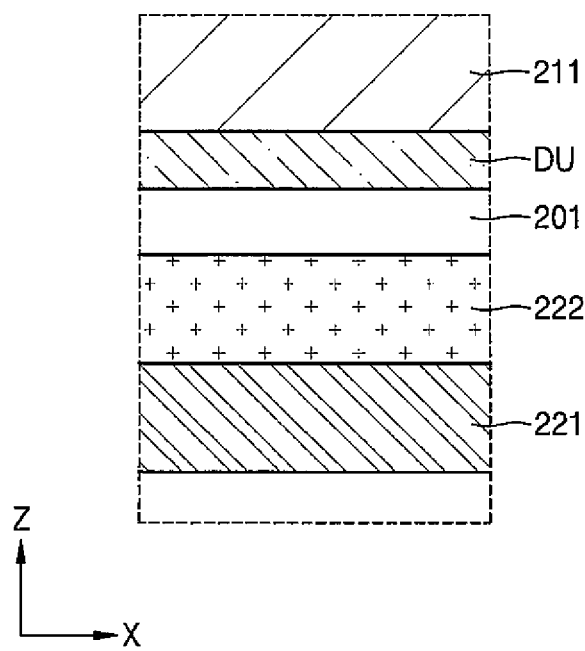

FIG. 39 is an enlarged view of K2 of FIG. 37.

Referring to FIG. 39, the display unit DU is formed on the substrate 201. The display unit DU may be various types configured to display visible rays. Although not shown, the display unit DU may include the components described in FIG. 23.

The first protective layer 211 may cover the display unit DU, as illustrated in FIG. 22. Also, according to some example embodiments, a first adhesive layer may be arranged between the display unit DU and the first protective layer 211.

According to another example embodiment, the first protective layer 211 may not cover the display unit DU. That is, the first protective layer 211 may be formed only on an area of the substrate 201, on which the cutting process of the substrate 201 is to be performed, rather than the entire surface of the substrate 201, and may not cover the display unit DU.

Also, the display unit DU may not be included on the area of the first protective layer 211, on which the removal area 211a is to be formed in a sequential process. According to some example embodiments, the display unit DU may be formed to at least partially overlap the area of the first protective layer 211, on which the removal area 211a is to be formed in a sequential process.

An encapsulation unit may further be included on the display unit DU as illustrated in FIG. 32.

Figure 40:
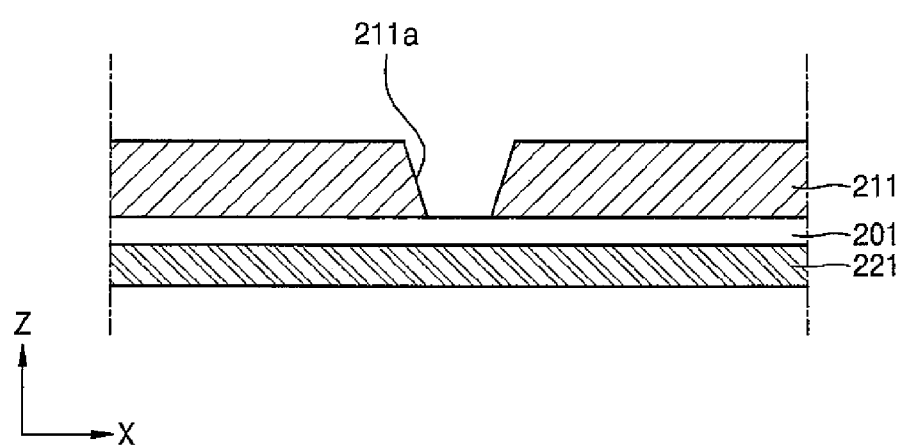

Then, referring to FIG. 40, a first laser beam is irradiated toward the first protective layer 211 to form the removal area 211a where an area of the first protective layer 211 is removed.

The process of forming the removal area 211a may be performed by using the method described with reference to FIG. 24A or 24B. Also, according to some example embodiments, when forming the removal area 211a, the method described with reference to FIGS. 10 and 11 may be used.

The removal area 211a and the display unit DU may be spaced apart from each other. According to some example embodiments, the removal area 211a may at least partially overlap the display unit DU.

Figure 41:
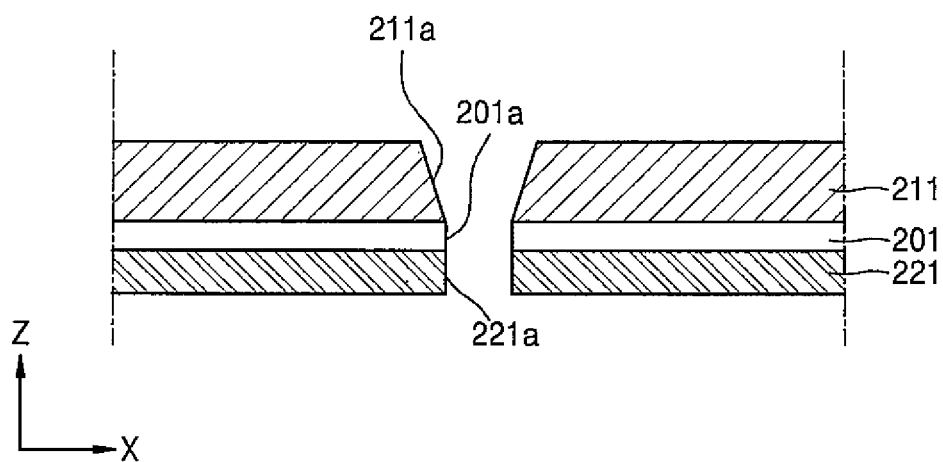

Then, a second laser beam is irradiated toward the removal area 211a and correspondingly to the removal area 211a to from the cutting area 201a on the substrate 201, as illustrated in FIG. 41. For example, the second laser beam may remove at least an area of the substrate 201, which overlaps the removal area 211a, to form the cutting area 201a.

The cutting area 201a may be spaced apart from the display unit DU. According to some example embodiments, the cutting area 201a may at least partially overlap the display unit DU.

Also, the cutting area 221a is formed on an area of the second protective layer 221, which overlaps the cutting area 201a of the substrate 201.

Figure 42:
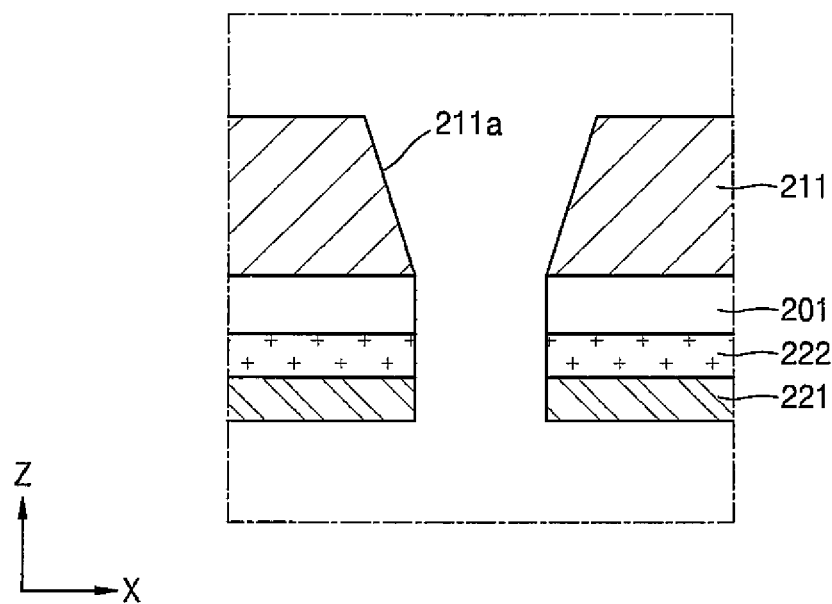

According to some example embodiments, when the second adhesive layer 222 is arranged between the substrate 201 and the second protective layer 221 as illustrated in FIG. 38, the cutting area 221a is also formed on the second adhesive layer 222 as illustrated in FIG. 42.

The substrate 201 may be cut into one or more areas via the cutting area 201a. Also, ultimately, the display apparatus 200 having the substrate 201 and the display unit DU is manufactured. Based on the cutting area 201a, an area which is adjacent to the display apparatus 200 may be the dummy area 200D. According to some example embodiments, based on the cutting area 201a, another display apparatus, rather than the dummy area 200D, may be arranged on the area adjacent to the display apparatus 200.

Figure 43:
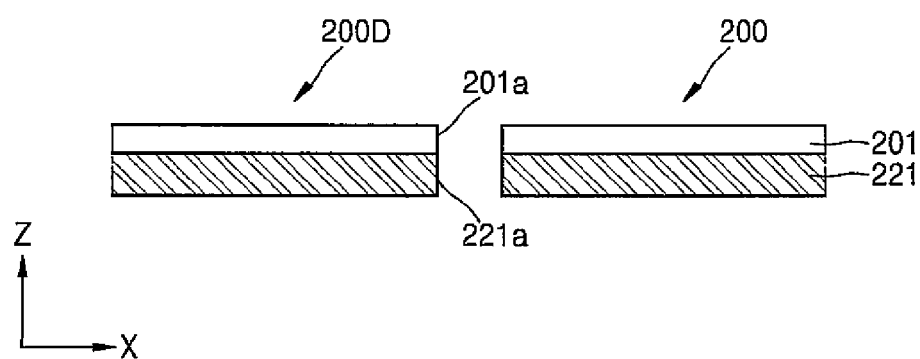

According to some example embodiments, the first protective layer 211 may be removed as illustrated in FIG. 43.

The method of cutting the substrate according to the present example embodiment includes forming the cutting area 201a on the substrate 201 after forming the first protective layer 211 on the substrate 201. Accordingly, the substrate 201 may be easily protected, and when the substrate 201 is formed of a material sensitive to heat, such as an organic material, thermal damage that may occur to the substrate 201 during a cutting process may be reduced. Also, if the first protective layer 211 is removed after the cutting process is performed such that the first protective layer 211 may be easily removed from the substrate 201, the surface damage of the substrate 201 may be reduced. In addition, via this, the display unit DU may have less thermal damage or thermal effect, or the thermal damage or thermal effect on the display unit DU may be prevented or reduced. Also, when the cutting process is performed when the first protective layer 211 covers the display unit DU, or the encapsulation unit E covering the display unit DU, damage to the display unit DU may be reduced or prevented.

Also, according to the present example embodiment, the second protective layer 221 is formed on the surface that is opposite to the surface of the substrate 201, which faces the first protective layer 211, in order to effectively protect the substrate 201. In particular, when the substrate 201 is formed of a flexible material such as plastic, shocks, heat, etc. applied to the substrate 201 during the cutting process of the substrate 201 may be alleviated to reduce or prevent damage to the substrate 201.

Also, according to the present example embodiment, the first protective layer 211 is formed on a surface of the substrate 201, and then, the first laser beam LB1 is irradiated toward the first protective layer 211 to form the removal area 211a. Then, the second laser beam LB2 is irradiated toward the removal area 211a to remove an area of the substrate 201, which overlaps the removal area 211a, in order to form the cutting area 201a. Accordingly, a precise cutting process with respect to the substrate 201 may be performed while minimizing or reducing damage of the substrate 201.

Figure 44:
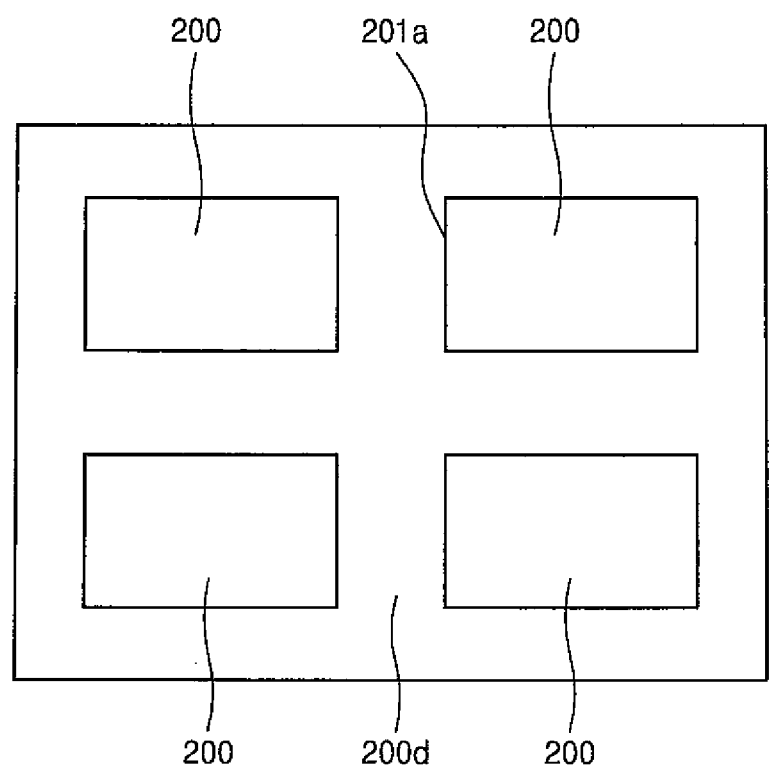
FIGS. 44 and 45 are plan views for describing an arrangement of a display apparatus, which is formed by a method of manufacturing a display apparatus, according to an example embodiment of the present invention.
Figure 45:
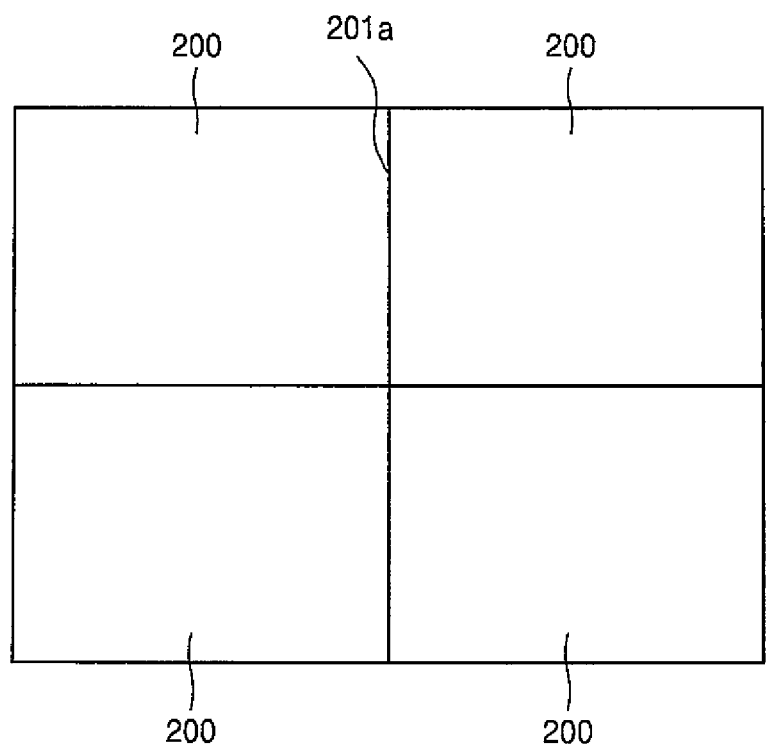

FIGS. 44 and 45 are plan views for describing an arrangement of the display apparatus 200, which is manufactured by using the method of manufacturing a display apparatus according to example embodiments.

That is, FIGS. 44 and 45 may describe the process according to an example embodiment, which corresponds to at least one of the example embodiment of FIGS. 21 through 28, the example embodiment of FIGS. 29 through 36, and the example embodiment of FIGS. 37 through 43.

FIGS. 44 and 45 includes the process in which the cutting area 201a is formed by performing a cutting process with respect to a mother substrate, and four display apparatuses 200 are formed via the cutting area 201a.

This is an example embodiment, and the cutting area 201a may have various shapes. Also, the shapes and sizes of the display apparatus 200 which may be formed via the cutting area 201a may vary.

Referring to FIG. 44, based on the cutting area 201a, the display apparatus 200 and the dummy area 200D adjacent to the display apparatus 200 are formed. That is, a side of the cutting area 201a corresponds to the display apparatus 200, and the other side of the cutting area 201a corresponds to the dummy area 200D. According to some example embodiments, the cutting area 201a for dividing the display apparatus 200 and the dummy area 200D may be formed between the display apparatus 200 and the dummy area 200D, as illustrated in FIG. 44.

As another example, referring to FIG. 45, based on the cutting area 201a, the display apparatus 200 and at least one another display apparatus 200 adjacent to the display apparatus 200 are arranged. That is, a side of the cutting area 201a corresponds to the display apparatus 200 and the other side of the cutting area 201a corresponds to the other display apparatus 200. According to some example embodiments, the cutting area 201a may be formed to divide the display apparatus 200 and the other adjacent display apparatus 200, as illustrated in FIG. 45.

As described above, according to the one or more of the above example embodiments, the method of cutting the substrate and the method of manufacturing the display apparatus, whereby damage in the substrate is reduced and an efficiency of the cutting process is improved, may be provided.

It should be understood that example embodiments described herein should be considered in a descriptive sense only and not for purposes of limitation. Descriptions of features or aspects within each example embodiment should typically be considered as available for other similar features or aspects in other example embodiments.

While one or more example embodiments have been described with reference to the figures, it will be understood by those of ordinary skill in the art that various changes in form and details may be made therein without departing from the spirit and scope as defined by the following claims, and their equivalents.

What is claimed is:

1. A method of cutting a substrate, the method comprising:
   forming a first protective layer on a first surface of the substrate;
   forming a removal area where a portion of the first shielding layer is removed by irradiating the first protective layer at the portion of the first protective layer with a first laser beam;
   forming a cutting area by removing a portion of the substrate by irradiating the substrate with a second laser beam at the removal area, after irradiating the first protective layer with the first laser beam; and
   after the forming of the cutting area, removing the first protective layer from the substrate.

2. The method of claim 1, further comprising forming a first adhesive layer between the first protective layer and the substrate.

3. The method of claim 1, wherein the irradiating of the first protective layer with the first laser beam comprises controlling the first laser beam such that a focus of the first laser beam is spaced apart from an upper surface of the first protective layer.

4. The method of claim 1, wherein the second laser beam is a pulse laser beam and has a pulse width of femto seconds to hundreds of femto seconds.

5. The method of claim 1, wherein the forming of the removal area comprises:
   forming, on the first protective layer, a plurality of preliminary removal areas spaced apart from one another by irradiating the first protective layer with the first laser beam at the preliminary removal areas; and irradiating the first protective layer with the first laser beam at areas between the plurality of preliminary removal areas.

6. The method of claim 1, further comprising forming a second protective layer on a second surface of the substrate that is opposite the first surface of the substrate.

7. The method of claim 6, further comprising forming a second adhesive layer between the second protective layer and the substrate.

8. The method of claim 6, further comprising forming the cutting area by removing a portion of the second protective layer by irradiating the second protective layer with the second laser beam at the portion of the second protective layer.

9. The method of claim 6, wherein the second protective layer is thinner than the first protective layer.

10. A method of manufacturing a display apparatus comprising a display unit formed on a substrate, the method comprising:
    forming a first protective layer on a first surface of the substrate;
    forming a removal area where a portion of the first protective layer is removed by irradiating the first protective layer with a first laser beam;
    forming a cutting area by removing a portion of the substrate by irradiating the substrate with a second laser beam at the removal area, after irradiating the first protective layer with the first laser beam; and
    after the forming of the cutting area, removing the first protective layer from the substrate.

11. The method of claim 10, further comprising positioning the display unit on the first surface of the substrate, wherein the display unit is apart from the cutting area on the substrate.

12. The method of claim 10, further comprising positioning the display unit on the first surface of the substrate, wherein the display unit overlaps the cutting area on the substrate.

13. The method of claim 10, wherein the first protective layer covers the display unit.

14. The method of claim 10, wherein the first protective layer does not overlap the display unit.

15. The method of claim 10, further comprising forming an encapsulating unit on the display unit, wherein the encapsulating unit is arranged between the display unit and the first protective layer.

16. The method of claim 10, further comprising forming a first adhesive layer between the first protective layer and the substrate.

17. The method of claim 16, wherein the first adhesive layer is between the first protective layer and the display unit.

18. The method of claim 10, wherein the irradiating of the first protective layer with the first laser beam comprises controlling the first laser beam such that a focus of the first laser beam is spaced apart from an upper surface of the first protective layer.

19. The method of claim 10, wherein the second laser beam is a pulse laser beam, and has a pulse width of femto seconds to hundreds of femto seconds.

20. The method of claim 10, wherein the forming of the removal area comprises:
    forming, on the first protective layer, a plurality of preliminary removal areas spaced apart from one another by irradiating the first protective layer with the first laser beam at the preliminary removal areas; and
    irradiating the first protective layer with the first laser beam at areas between the plurality of preliminary removal areas.

21. The method of claim 10, further comprising forming a second protective layer on a second surface of the substrate opposite the first surface of the substrate.

22. The method of claim 21, further comprising forming a second adhesive layer between the second protective layer and the substrate.

23. The method of claim 21, further comprising forming the cutting area by removing a portion of the second protective layer by irradiating the second protective layer with the second laser beam at the portion of the second protective layer.

24. The method of claim 21, wherein the second protective layer is thinner than the first protective layer.

25. The method of claim 10, wherein the cutting area is formed so that the display apparatus and a dummy area adjacent the display apparatus are formed, based on the formed cutting area, and
    the cutting area is between the display apparatus and the dummy area.

26. The method of claim 10, wherein the cutting area is formed so that the display apparatus and another display apparatus adjacent the display apparatus are formed, based on the formed cutting area, and
    the cutting area is between the display apparatus and the another display apparatus.

* * * * *